US009673825B2

(12) United States Patent
Becker

(10) Patent No.: US 9,673,825 B2
(45) Date of Patent: Jun. 6, 2017

(54) CIRCUITRY AND LAYOUTS FOR XOR AND XNOR LOGIC

(71) Applicant: Tela Innovations, Inc., Los Gatos, CA (US)

(72) Inventor: Scott T. Becker, Scotts Valley, CA (US)

(73) Assignee: Tela Innovations, Inc., Los Gatos, CA (US)

( * ) Notice: Subject to any disclaimer, the term of this patent is extended or adjusted under 35 U.S.C. 154(b) by 0 days.

(21) Appl. No.: 14/181,556

(22) Filed: Feb. 14, 2014

(65) Prior Publication Data

US 2014/0159772 A1   Jun. 12, 2014

Related U.S. Application Data

(60) Division of application No. 12/435,672, filed on May 5, 2009, now Pat. No. 8,653,857, and a (Continued)

(51) Int. Cl.
*H03K 19/20* (2006.01)
*H03K 19/21* (2006.01)
*G06F 17/50* (2006.01)

(52) U.S. Cl.
CPC ......... *H03K 19/20* (2013.01); *G06F 17/5068* (2013.01); *H03K 19/215* (2013.01)

(58) Field of Classification Search
CPC ................. H03K 19/20; H03K 19/215; H03K 19/00384; H03K 19/018571;
(Continued)

(56) References Cited

U.S. PATENT DOCUMENTS

| 4,069,493 A | 1/1978 | Bobenrieth |
| 4,197,555 A | 4/1980 | Uehara et al. |

(Continued)

FOREIGN PATENT DOCUMENTS

| EP | 0102644 | 7/1989 |
| EP | 0788166 | 8/1997 |

(Continued)

OTHER PUBLICATIONS

Kawasaki, H., et al., "Challenges and Solutions of FinFET Integration in an SRAM Cell and a Logic Circuit for 22 nm node and beyond," Electron Devices Meeting (IEDM), 2009 IEEE International, IEEE, Piscataway, NJ, USA, Dec. 7, 2009, pp. 1-4.

(Continued)

*Primary Examiner* — Alexander H Taningco
*Assistant Examiner* — Seokjin Kim
(74) *Attorney, Agent, or Firm* — Martine Penilla Group, LLP

(57) ABSTRACT

An exclusive-or circuit includes a pass gate controlled by a second input node. The pass gate is connected to pass through a version of a logic state present at a first input node to an output node when so controlled. A transmission gate is controlled by the first input node. The transmission gate is connected to pass through a version of the logic state present at the second input node to the output node when so controlled. Pullup logic is controlled by both the first and second input nodes. The pullup logic is connected to drive the output node low when both the first and second input nodes are high. An exclusive-nor circuit is defined similar to the exclusive-or circuit, except that the pullup logic is replaced by pulldown logic which is connected to drive the output node high when both the first and second input nodes are high.

19 Claims, 12 Drawing Sheets

Related U.S. Application Data continuation-in-part of application No. 12/212,562, filed on Sep. 17, 2008, now Pat. No. 7,842,975, which is a continuation of application No. 11/683,402, filed on Mar. 7, 2007, now Pat. No. 7,446,352.

(60) Provisional application No. 61/174,408, filed on Apr. 30, 2009, provisional application No. 60/781,288, filed on Mar. 9, 2006.

(58) Field of Classification Search
CPC ... H03K 19/017581; H03K 19/018557; H03K 19/0948; H03K 19/1737; G06F 7/607; G11C 15/04; G11C 8/10
USPC ... 326/52–55, 6, 7, 104, 108, 106, 112–113, 326/119, 121; 257/202–206, 211, 390, 257/909, E21.661, E27.099
See application file for complete search history.

(56) References Cited

U.S. PATENT DOCUMENTS

| | | |
|---|---|---|
| 4,417,161 A | 11/1983 | Uya |
| 4,424,460 A | 1/1984 | Best |
| 4,575,648 A * | 3/1986 | Lee ................ H03K 19/215 326/54 |
| 4,602,270 A | 7/1986 | Finegold |
| 4,613,940 A | 9/1986 | Shenton |
| 4,657,628 A | 4/1987 | Holloway et al. |
| 4,682,202 A | 7/1987 | Tanizawa |
| 4,745,084 A | 5/1988 | Rowson et al. |
| 4,780,753 A | 10/1988 | Ohkura et al. |
| 4,801,986 A | 1/1989 | Chang et al. |
| 4,804,636 A | 2/1989 | Groover, III |
| 4,812,688 A | 3/1989 | Chu et al. |
| 4,884,115 A | 11/1989 | Michel et al. |
| 4,928,160 A | 5/1990 | Crafts |
| 4,975,756 A | 12/1990 | Haken et al. |
| 5,047,979 A | 9/1991 | Leung |
| 5,068,603 A | 11/1991 | Mahoney |
| 5,079,614 A | 1/1992 | Khatakhotan |
| 5,097,422 A | 3/1992 | Corbin et al. |
| 5,117,277 A | 5/1992 | Yuyama et al. |
| 5,121,186 A | 6/1992 | Wong et al. |
| 5,208,765 A | 5/1993 | Turnbull |
| 5,224,057 A | 6/1993 | Igarashi |
| 5,242,770 A | 9/1993 | Chen et al. |
| 5,268,319 A | 12/1993 | Harari |
| 5,298,774 A | 3/1994 | Ueda et al. |
| 5,313,426 A | 5/1994 | Sakuma et al. |
| 5,338,963 A | 8/1994 | Klaasen |
| 5,351,197 A | 9/1994 | Upton et al. |
| 5,359,226 A | 10/1994 | DeJong |
| 5,365,454 A | 11/1994 | Nakagawa et al. |
| 5,367,187 A | 11/1994 | Yuen |
| 5,378,649 A | 1/1995 | Huang |
| 5,396,128 A | 3/1995 | Dunning et al. |
| 5,420,447 A | 5/1995 | Waggoner |
| 5,461,577 A | 10/1995 | Shaw et al. |
| 5,471,403 A | 11/1995 | Fujimaga |
| 5,497,334 A | 3/1996 | Russell et al. |
| 5,497,337 A | 3/1996 | Ponnapalli et al. |
| 5,526,307 A | 6/1996 | Lin et al. |
| 5,536,955 A | 7/1996 | Ali |
| 5,545,904 A | 8/1996 | Orbach |
| 5,581,098 A | 12/1996 | Chang |
| 5,581,202 A | 12/1996 | Yano et al. |
| 5,612,893 A | 3/1997 | Hao et al. |
| 5,636,002 A | 6/1997 | Garofalo |
| 5,656,861 A | 8/1997 | Godinho et al. |
| 5,682,323 A | 10/1997 | Pasch et al. |
| 5,684,311 A | 11/1997 | Shaw |
| 5,684,733 A | 11/1997 | Wu et al. |
| 5,698,873 A | 12/1997 | Colwell et al. |
| 5,705,301 A | 1/1998 | Garza et al. |
| 5,723,883 A | 3/1998 | Gheewalla |
| 5,723,908 A | 3/1998 | Fuchida et al. |
| 5,740,068 A | 4/1998 | Liebmann et al. |
| 5,745,374 A | 4/1998 | Matsumoto |
| 5,764,533 A | 6/1998 | deDood |
| 5,774,367 A | 6/1998 | Reyes et al. |
| 5,780,909 A | 7/1998 | Hayashi |
| 5,789,776 A | 8/1998 | Lancaster et al. |
| 5,790,417 A | 8/1998 | Chao et al. |
| 5,796,128 A | 8/1998 | Tran et al. |
| 5,796,624 A | 8/1998 | Sridhar et al. |
| 5,798,298 A | 8/1998 | Yang et al. |
| 5,814,844 A | 9/1998 | Nagata et al. |
| 5,825,203 A | 10/1998 | Kusunoki et al. |
| 5,834,851 A | 11/1998 | Ikeda et al. |
| 5,838,594 A | 11/1998 | Kojima |
| 5,841,663 A | 11/1998 | Sharma et al. |
| 5,847,421 A | 12/1998 | Yamaguchi |
| 5,850,362 A | 12/1998 | Sakuma et al. |
| 5,852,562 A | 12/1998 | Shinomiya et al. |
| 5,858,580 A | 1/1999 | Wang et al. |
| 5,898,194 A | 4/1999 | Gheewala |
| 5,900,340 A | 5/1999 | Reich et al. |
| 5,905,287 A | 5/1999 | Hirata |
| 5,908,827 A | 6/1999 | Sirna |
| 5,915,199 A | 6/1999 | Hsu |
| 5,917,207 A | 6/1999 | Colwell et al. |
| 5,920,486 A | 7/1999 | Beahm et al. |
| 5,923,059 A | 7/1999 | Gheewala |
| 5,923,060 A | 7/1999 | Gheewala |
| 5,929,469 A | 7/1999 | Mimoto et al. |
| 5,930,163 A | 7/1999 | Hara et al. |
| 5,935,763 A | 8/1999 | Caterer et al. |
| 5,949,101 A | 9/1999 | Aritome |
| 5,973,507 A | 10/1999 | Yamazaki |
| 5,977,305 A | 11/1999 | Wigler et al. |
| 5,977,574 A | 11/1999 | Schmitt et al. |
| 5,998,879 A | 12/1999 | Iwaki et al. |
| 6,009,251 A | 12/1999 | Ho et al. |
| 6,026,223 A | 2/2000 | Scepanovic et al. |
| 6,037,613 A | 3/2000 | Mariyama |
| 6,037,617 A * | 3/2000 | Kumagai ................ 257/262 |
| 6,044,007 A | 3/2000 | Capodieci |
| 6,054,872 A | 4/2000 | Fudanuki et al. |
| 6,063,132 A | 5/2000 | DeCamp et al. |
| 6,077,310 A | 6/2000 | Yamamoto et al. |
| 6,080,206 A | 6/2000 | Tadokoro et al. |
| 6,084,255 A | 7/2000 | Ueda |
| 6,084,437 A * | 7/2000 | Sako ................ 326/113 |
| 6,091,845 A | 7/2000 | Pierrat et al. |
| 6,099,584 A | 8/2000 | Arnold et al. |
| 6,100,025 A | 8/2000 | Wigler et al. |
| 6,114,071 A | 9/2000 | Chen et al. |
| 6,144,227 A | 11/2000 | Sato |
| 6,159,839 A | 12/2000 | Jeng et al. |
| 6,166,415 A | 12/2000 | Sakemi et al. |
| 6,166,560 A | 12/2000 | Ogura et al. |
| 6,174,742 B1 | 1/2001 | Sudhindranath et al. |
| 6,182,272 B1 | 1/2001 | Andreev et al. |
| 6,194,104 B1 | 2/2001 | Hsu |
| 6,194,252 B1 | 2/2001 | Yamaguchi |
| 6,194,912 B1 | 2/2001 | Or-Bach |
| 6,209,123 B1 | 3/2001 | Maziasz et al. |
| 6,230,299 B1 | 5/2001 | McSherry et al. |
| 6,232,173 B1 | 5/2001 | Hsu et al. |
| 6,240,542 B1 | 5/2001 | Kapur |
| 6,249,902 B1 | 6/2001 | Igusa et al. |
| 6,255,600 B1 | 7/2001 | Schaper |
| 6,255,845 B1 | 7/2001 | Wong et al. |
| 6,262,487 B1 | 7/2001 | Igarashi et al. |
| 6,269,472 B1 | 7/2001 | Garza et al. |
| 6,275,973 B1 | 8/2001 | Wein |
| 6,282,696 B1 | 8/2001 | Garza et al. |
| 6,291,276 B1 | 9/2001 | Gonzalez |
| 6,297,668 B1 | 10/2001 | Schober |
| 6,297,674 B1 | 10/2001 | Kono et al. |
| 6,303,252 B1 | 10/2001 | Lin |
| 6,331,733 B1 | 12/2001 | Or-Bach et al. |
| 6,331,791 B1 | 12/2001 | Huang |

(56) References Cited

U.S. PATENT DOCUMENTS

| | | |
|---|---|---|
| 6,335,250 B1 | 1/2002 | Egi |
| 6,338,972 B1 | 1/2002 | Sudhindranath et al. |
| 6,347,062 B2 | 2/2002 | Nii et al. |
| 6,356,112 B1 | 3/2002 | Tran et al. |
| 6,359,804 B2 | 3/2002 | Kuriyama et al. |
| 6,370,679 B1 | 4/2002 | Chang et al. |
| 6,378,110 B1 | 4/2002 | Ho |
| 6,380,592 B2 | 4/2002 | Tooher et al. |
| 6,388,296 B1 | 5/2002 | Hsu |
| 6,393,601 B1 | 5/2002 | Tanaka et al. |
| 6,399,972 B1 | 6/2002 | Masuda et al. |
| 6,400,183 B2 | 6/2002 | Yamashita et al. |
| 6,408,427 B1 | 6/2002 | Cong et al. |
| 6,415,421 B2 | 7/2002 | Anderson et al. |
| 6,416,907 B1 | 7/2002 | Winder et al. |
| 6,417,549 B1 | 7/2002 | Oh |
| 6,421,820 B1 | 7/2002 | Mansfield et al. |
| 6,425,112 B1 | 7/2002 | Bula et al. |
| 6,425,117 B1 | 7/2002 | Pasch et al. |
| 6,426,269 B1 | 7/2002 | Haffner et al. |
| 6,436,805 B1 | 8/2002 | Trivedi |
| 6,445,049 B1 | 9/2002 | Iranmanesh |
| 6,445,065 B1 | 9/2002 | Gheewala et al. |
| 6,467,072 B1 | 10/2002 | Yang et al. |
| 6,469,328 B2 | 10/2002 | Yanai et al. |
| 6,470,489 B1 | 10/2002 | Chang et al. |
| 6,476,493 B2 | 11/2002 | Or-Bach et al. |
| 6,477,695 B1 | 11/2002 | Gandhi |
| 6,480,032 B1 | 11/2002 | Aksamit |
| 6,480,989 B2 | 11/2002 | Chan et al. |
| 6,492,066 B1 | 12/2002 | Capodieci et al. |
| 6,496,965 B1 | 12/2002 | van Ginneken et al. |
| 6,504,186 B2 | 1/2003 | Kanamoto et al. |
| 6,505,327 B2 | 1/2003 | Lin |
| 6,505,328 B1 | 1/2003 | van Ginneken et al. |
| 6,507,941 B1 | 1/2003 | Leung et al. |
| 6,509,952 B1 | 1/2003 | Govil et al. |
| 6,514,849 B1 | 2/2003 | Hui et al. |
| 6,516,459 B1 | 2/2003 | Sahouria |
| 6,523,156 B2 | 2/2003 | Cirit |
| 6,525,350 B1 | 2/2003 | Kinoshita et al. |
| 6,536,028 B1 | 3/2003 | Katsioulas et al. |
| 6,543,039 B1 | 4/2003 | Watanabe |
| 6,553,544 B2 | 4/2003 | Tanaka et al. |
| 6,553,559 B2 | 4/2003 | Liebmann et al. |
| 6,553,562 B2 | 4/2003 | Capodieci et al. |
| 6,566,720 B2 | 5/2003 | Aldrich |
| 6,570,234 B1 | 5/2003 | Gardner |
| 6,571,140 B1 | 5/2003 | Wewalaarachchi et al. |
| 6,571,379 B2 | 5/2003 | Takayama |
| 6,574,786 B1 | 6/2003 | Pohlenz et al. |
| 6,578,190 B2 | 6/2003 | Ferguson et al. |
| 6,583,041 B1 | 6/2003 | Capodieci |
| 6,588,005 B1 | 7/2003 | Kobayashi et al. |
| 6,590,289 B2 | 7/2003 | Shively |
| 6,591,207 B2 | 7/2003 | Naya et al. |
| 6,609,235 B2 | 8/2003 | Ramaswamy et al. |
| 6,610,607 B1 | 8/2003 | Armbrust et al. |
| 6,617,621 B1 | 9/2003 | Gheewala et al. |
| 6,620,561 B2 | 9/2003 | Winder et al. |
| 6,621,132 B2 | 9/2003 | Onishi et al. |
| 6,632,741 B1 | 10/2003 | Clevenger et al. |
| 6,633,182 B2 | 10/2003 | Pileggi et al. |
| 6,635,935 B2 | 10/2003 | Makino |
| 6,642,744 B2 | 11/2003 | Or-Bach et al. |
| 6,643,831 B2 | 11/2003 | Chang et al. |
| 6,650,014 B2 | 11/2003 | Kariyazaki |
| 6,661,041 B2 | 12/2003 | Keeth |
| 6,662,350 B2 | 12/2003 | Fried et al. |
| 6,664,587 B2 | 12/2003 | Guterman et al. |
| 6,673,638 B1 | 1/2004 | Bendik et al. |
| 6,677,649 B2 | 1/2004 | Minami et al. |
| 6,687,895 B2 | 2/2004 | Zhang |
| 6,690,206 B2 | 2/2004 | Rikino et al. |
| 6,691,297 B1 | 2/2004 | Misaka et al. |
| 6,700,405 B1 * | 3/2004 | Hirairi .......................... 326/53 |
| 6,703,170 B1 | 3/2004 | Pindo |
| 6,709,880 B2 | 3/2004 | Yamamoto et al. |
| 6,714,903 B1 | 3/2004 | Chu et al. |
| 6,732,334 B2 | 5/2004 | Nakatsuka |
| 6,732,338 B2 | 5/2004 | Crouse et al. |
| 6,732,344 B2 | 5/2004 | Sakamoto et al. |
| 6,734,506 B2 | 5/2004 | Oyamatsu |
| 6,737,199 B1 | 5/2004 | Hsieh |
| 6,737,318 B2 | 5/2004 | Murata et al. |
| 6,737,347 B1 | 5/2004 | Houston et al. |
| 6,745,372 B2 | 6/2004 | Cote et al. |
| 6,745,380 B2 | 6/2004 | Bodendorf et al. |
| 6,749,972 B2 | 6/2004 | Yu |
| 6,750,555 B2 | 6/2004 | Satomi et al. |
| 6,760,269 B2 | 7/2004 | Nakase et al. |
| 6,765,245 B2 * | 7/2004 | Bansal ........................ 257/202 |
| 6,777,138 B2 | 8/2004 | Pierrat et al. |
| 6,777,146 B1 | 8/2004 | Samuels |
| 6,787,823 B2 | 9/2004 | Shibutani |
| 6,789,244 B1 | 9/2004 | Dasasathyan et al. |
| 6,789,246 B1 | 9/2004 | Mohan et al. |
| 6,792,591 B2 | 9/2004 | Shi et al. |
| 6,792,593 B2 | 9/2004 | Takashima et al. |
| 6,794,677 B2 | 9/2004 | Tamaki et al. |
| 6,794,914 B2 | 9/2004 | Sani et al. |
| 6,795,332 B2 | 9/2004 | Yamaoka et al. |
| 6,795,358 B2 | 9/2004 | Tanaka et al. |
| 6,795,952 B1 | 9/2004 | Stine et al. |
| 6,795,953 B2 | 9/2004 | Bakarian et al. |
| 6,800,883 B2 | 10/2004 | Furuya et al. |
| 6,806,180 B2 | 10/2004 | Cho |
| 6,807,663 B2 | 10/2004 | Cote et al. |
| 6,809,399 B2 | 10/2004 | Shimizu et al. |
| 6,812,574 B2 | 11/2004 | Tomita et al. |
| 6,818,389 B2 | 11/2004 | Fritze et al. |
| 6,818,929 B2 | 11/2004 | Tsutsumi et al. |
| 6,819,136 B2 | 11/2004 | Or-Bach |
| 6,820,248 B1 | 11/2004 | Gan |
| 6,826,738 B2 | 11/2004 | Cadouri |
| 6,834,375 B1 | 12/2004 | Stine et al. |
| 6,841,880 B2 | 1/2005 | Matsumoto et al. |
| 6,850,854 B2 | 2/2005 | Naya et al. |
| 6,854,096 B2 | 2/2005 | Eaton et al. |
| 6,854,100 B1 | 2/2005 | Chuang et al. |
| 6,867,073 B1 | 3/2005 | Enquist |
| 6,871,338 B2 | 3/2005 | Yamauchi |
| 6,872,990 B1 | 3/2005 | Kang |
| 6,877,144 B1 | 4/2005 | Rittman et al. |
| 6,881,523 B2 | 4/2005 | Smith |
| 6,884,712 B2 | 4/2005 | Yelehanka et al. |
| 6,885,045 B2 | 4/2005 | Hidaka |
| 6,889,370 B1 | 5/2005 | Kerzman et al. |
| 6,897,517 B2 | 5/2005 | Houdt et al. |
| 6,897,536 B2 | 5/2005 | Nomura et al. |
| 6,898,770 B2 | 5/2005 | Boluki et al. |
| 6,904,582 B1 | 6/2005 | Rittman et al. |
| 6,918,104 B2 | 7/2005 | Pierrat et al. |
| 6,920,079 B2 | 7/2005 | Shibayama |
| 6,921,982 B2 | 7/2005 | Joshi et al. |
| 6,922,354 B2 | 7/2005 | Ishikura et al. |
| 6,924,560 B2 | 8/2005 | Wang et al. |
| 6,928,635 B2 | 8/2005 | Pramanik et al. |
| 6,931,617 B2 | 8/2005 | Sanie et al. |
| 6,953,956 B2 | 10/2005 | Or-Bach et al. |
| 6,954,918 B2 | 10/2005 | Houston |
| 6,957,402 B2 | 10/2005 | Templeton et al. |
| 6,968,527 B2 | 11/2005 | Pierrat |
| 6,974,978 B1 | 12/2005 | Possley |
| 6,977,856 B2 | 12/2005 | Tanaka et al. |
| 6,978,436 B2 | 12/2005 | Cote et al. |
| 6,978,437 B1 | 12/2005 | Rittman et al. |
| 6,980,211 B2 | 12/2005 | Lin et al. |
| 6,992,394 B2 | 1/2006 | Park |
| 6,992,925 B2 | 1/2006 | Peng |
| 6,993,741 B2 | 1/2006 | Liebmann et al. |
| 6,994,939 B1 | 2/2006 | Ghandehari et al. |
| 6,998,722 B2 | 2/2006 | Madurawe |
| 7,003,068 B2 | 2/2006 | Kushner et al. |

(56) References Cited

U.S. PATENT DOCUMENTS

| | | | |
|---|---|---|---|
| 7,009,862 B2 | 3/2006 | Higeta et al. |
| 7,016,214 B2 | 3/2006 | Kawamata et al. |
| 7,022,559 B2 | 4/2006 | Barnak et al. |
| 7,028,285 B2 | 4/2006 | Cote et al. |
| 7,041,568 B2 | 5/2006 | Goldbach et al. |
| 7,052,972 B2 | 5/2006 | Sandhu et al. |
| 7,053,424 B2 | 5/2006 | Ono |
| 7,063,920 B2 | 6/2006 | Baba-Ali |
| 7,064,068 B2 | 6/2006 | Chou et al. |
| 7,065,731 B2 | 6/2006 | Jacques et al. |
| 7,079,413 B2 | 7/2006 | Tsukamoto et al. |
| 7,079,989 B2 | 7/2006 | Wimer |
| 7,093,208 B2 | 8/2006 | Williams et al. |
| 7,093,228 B2 | 8/2006 | Andreev et al. |
| 7,103,870 B2 | 9/2006 | Misaka et al. |
| 7,105,871 B2 | 9/2006 | Or-Bach et al. |
| 7,107,551 B1 | 9/2006 | de Dood et al. |
| 7,115,343 B2 | 10/2006 | Gordon et al. |
| 7,115,920 B2 | 10/2006 | Bernstein et al. |
| 7,120,882 B2 | 10/2006 | Kotani et al. |
| 7,124,386 B2 | 10/2006 | Smith et al. |
| 7,126,837 B1 | 10/2006 | Banachowicz et al. |
| 7,132,203 B2 | 11/2006 | Pierrat |
| 7,137,092 B2 | 11/2006 | Maeda |
| 7,141,853 B2 | 11/2006 | Campbell et al. |
| 7,143,380 B1 | 11/2006 | Anderson et al. |
| 7,149,999 B2 | 12/2006 | Kahng et al. |
| 7,152,215 B2 | 12/2006 | Smith et al. |
| 7,155,685 B2 | 12/2006 | Mori et al. |
| 7,155,689 B2 | 12/2006 | Pierrat et al. |
| 7,159,197 B2 | 1/2007 | Falbo et al. |
| 7,174,520 B2 | 2/2007 | White et al. |
| 7,175,940 B2 | 2/2007 | Laidig et al. |
| 7,176,508 B2 | 2/2007 | Joshi et al. |
| 7,177,215 B2 | 2/2007 | Tanaka et al. |
| 7,183,611 B2 | 2/2007 | Bhattacharyya |
| 7,185,294 B2 | 2/2007 | Zhang |
| 7,188,322 B2 | 3/2007 | Cohn et al. |
| 7,194,712 B2 | 3/2007 | Wu |
| 7,200,835 B2 | 4/2007 | Zhang et al. |
| 7,202,517 B2 | 4/2007 | Dixit et al. |
| 7,205,191 B2 | 4/2007 | Kobayashi |
| 7,208,794 B2 | 4/2007 | Hofmann et al. |
| 7,214,579 B2 | 5/2007 | Widdershoven et al. |
| 7,219,326 B2 | 5/2007 | Reed et al. |
| 7,221,031 B2 | 5/2007 | Ryoo et al. |
| 7,225,423 B2 | 5/2007 | Bhattacharya et al. |
| 7,227,183 B2 | 6/2007 | Donze et al. |
| 7,228,510 B2 | 6/2007 | Ono |
| 7,231,628 B2 | 6/2007 | Pack et al. |
| 7,235,424 B2 | 6/2007 | Chen et al. |
| 7,243,316 B2 | 7/2007 | White et al. |
| 7,252,909 B2 | 8/2007 | Shin et al. |
| 7,257,017 B2 | 8/2007 | Liaw |
| 7,264,990 B2 | 9/2007 | Rueckes et al. |
| 7,266,787 B2 * | 9/2007 | Hughes et al. ............... 257/374 |
| 7,269,803 B2 | 9/2007 | Khakzadi et al. |
| 7,278,118 B2 | 10/2007 | Pileggi et al. |
| 7,279,727 B2 | 10/2007 | Ikoma et al. |
| 7,287,320 B2 | 10/2007 | Wang et al. |
| 7,294,534 B2 | 11/2007 | Iwaki |
| 7,302,651 B2 | 11/2007 | Allen et al. |
| 7,308,669 B2 | 12/2007 | Buehler et al. |
| 7,312,003 B2 | 12/2007 | Cote et al. |
| 7,315,994 B2 | 1/2008 | Aller et al. |
| 7,327,591 B2 | 2/2008 | Sadra et al. |
| 7,329,938 B2 | 2/2008 | Kinoshita |
| 7,335,966 B2 | 2/2008 | Ihme et al. |
| 7,337,421 B2 | 2/2008 | Kamat |
| 7,338,896 B2 | 3/2008 | Vanhaelemeersch et al. |
| 7,345,909 B2 | 3/2008 | Chang et al. |
| 7,346,885 B2 | 3/2008 | Semmler |
| 7,350,183 B2 | 3/2008 | Cui et al. |
| 7,353,492 B2 | 4/2008 | Gupta et al. |
| 7,358,131 B2 | 4/2008 | Bhattacharyya |
| 7,360,179 B2 | 4/2008 | Smith et al. |
| 7,360,198 B2 | 4/2008 | Rana et al. |
| 7,366,997 B1 | 4/2008 | Rahmat et al. |
| 7,367,008 B2 | 4/2008 | White et al. |
| 7,376,931 B2 | 5/2008 | Kokubun |
| 7,383,521 B2 | 6/2008 | Smith et al. |
| 7,397,260 B2 | 7/2008 | Chanda et al. |
| 7,400,627 B2 | 7/2008 | Wu et al. |
| 7,402,848 B2 | 7/2008 | Chang et al. |
| 7,404,154 B1 | 7/2008 | Venkatraman et al. |
| 7,404,173 B2 | 7/2008 | Wu et al. |
| 7,411,252 B2 | 8/2008 | Anderson et al. |
| 7,421,678 B2 | 9/2008 | Barnes et al. |
| 7,423,298 B2 | 9/2008 | Mariyama et al. |
| 7,424,694 B2 | 9/2008 | Ikeda |
| 7,424,695 B2 | 9/2008 | Tamura et al. |
| 7,424,696 B2 | 9/2008 | Vogel et al. |
| 7,426,710 B2 | 9/2008 | Zhang et al. |
| 7,432,562 B2 | 10/2008 | Bhattacharyya |
| 7,434,185 B2 | 10/2008 | Dooling et al. |
| 7,441,211 B1 | 10/2008 | Gupta et al. |
| 7,442,630 B2 | 10/2008 | Kelberlau et al. |
| 7,444,609 B2 | 10/2008 | Charlebois et al. |
| 7,446,352 B2 | 11/2008 | Becker et al. |
| 7,449,371 B2 | 11/2008 | Kemerling et al. |
| 7,458,045 B2 | 11/2008 | Cote et al. |
| 7,459,792 B2 | 12/2008 | Chen |
| 7,465,973 B2 | 12/2008 | Chang et al. |
| 7,466,607 B2 | 12/2008 | Hollis et al. |
| 7,469,396 B2 | 12/2008 | Hayashi et al. |
| 7,480,880 B2 | 1/2009 | Visweswariah et al. |
| 7,480,891 B2 | 1/2009 | Sezginer |
| 7,484,197 B2 | 1/2009 | Allen et al. |
| 7,485,934 B2 | 2/2009 | Liaw |
| 7,487,475 B1 | 2/2009 | Kriplani et al. |
| 7,492,013 B2 | 2/2009 | Correale, Jr. |
| 7,500,211 B2 | 3/2009 | Komaki |
| 7,502,275 B2 | 3/2009 | Nii et al. |
| 7,503,026 B2 | 3/2009 | Ichiryu et al. |
| 7,504,184 B2 | 3/2009 | Hung et al. |
| 7,506,300 B2 | 3/2009 | Sezginer et al. |
| 7,508,238 B2 | 3/2009 | Yamagami |
| 7,509,621 B2 | 3/2009 | Melvin, III |
| 7,509,622 B2 | 3/2009 | Sinha et al. |
| 7,512,017 B2 | 3/2009 | Chang |
| 7,512,921 B2 | 3/2009 | Shibuya |
| 7,514,355 B2 | 4/2009 | Katase |
| 7,514,959 B2 | 4/2009 | Or-Bach et al. |
| 7,523,429 B2 | 4/2009 | Kroyan et al. |
| 7,527,900 B2 | 5/2009 | Zhou et al. |
| 7,538,368 B2 | 5/2009 | Yano |
| 7,543,262 B2 | 6/2009 | Wang et al. |
| 7,563,701 B2 | 7/2009 | Chang et al. |
| 7,564,134 B2 | 7/2009 | Yang et al. |
| 7,568,174 B2 | 7/2009 | Sezginer et al. |
| 7,569,309 B2 | 8/2009 | Blatchford et al. |
| 7,569,310 B2 | 8/2009 | Wallace et al. |
| 7,569,894 B2 | 8/2009 | Suzuki |
| 7,575,973 B2 | 8/2009 | Mokhlesi et al. |
| 7,598,541 B2 | 10/2009 | Okamoto et al. |
| 7,598,558 B2 | 10/2009 | Hashimoto et al. |
| 7,614,030 B2 | 11/2009 | Hsu |
| 7,625,790 B2 | 12/2009 | Yang |
| 7,632,610 B2 | 12/2009 | Wallace et al. |
| 7,640,522 B2 | 12/2009 | Gupta et al. |
| 7,646,651 B2 | 1/2010 | Lee et al. |
| 7,653,884 B2 | 1/2010 | Furnish et al. |
| 7,665,051 B2 | 2/2010 | Ludwig et al. |
| 7,700,466 B2 | 4/2010 | Booth et al. |
| 7,712,056 B2 | 5/2010 | White et al. |
| 7,739,627 B2 | 6/2010 | Chew et al. |
| 7,749,662 B2 | 7/2010 | Matthew et al. |
| 7,755,110 B2 | 7/2010 | Gliese et al. |
| 7,770,144 B2 | 8/2010 | Dellinger |
| 7,791,109 B2 | 9/2010 | Wann et al. |
| 7,802,219 B2 | 9/2010 | Tomar et al. |
| 7,825,437 B2 | 11/2010 | Pillarisetty et al. |
| 7,842,975 B2 | 11/2010 | Becker et al. |
| 7,873,929 B2 | 1/2011 | Kahng et al. |

(56) References Cited

U.S. PATENT DOCUMENTS

| | | |
|---|---|---|
| 7,882,456 B2 | 2/2011 | Zach |
| 7,888,705 B2 | 2/2011 | Becker et al. |
| 7,898,040 B2 | 3/2011 | Nawaz |
| 7,906,801 B2 | 3/2011 | Becker et al. |
| 7,908,578 B2 | 3/2011 | Becker et al. |
| 7,910,958 B2 | 3/2011 | Becker et al. |
| 7,910,959 B2 | 3/2011 | Becker et al. |
| 7,917,877 B2 | 3/2011 | Singh et al. |
| 7,917,879 B2 | 3/2011 | Becker et al. |
| 7,923,266 B2 | 4/2011 | Thijs et al. |
| 7,923,337 B2 | 4/2011 | Chang et al. |
| 7,923,757 B2 | 4/2011 | Becker et al. |
| 7,926,001 B2 | 4/2011 | Pierrat |
| 7,932,544 B2 | 4/2011 | Becker et al. |
| 7,932,545 B2 | 4/2011 | Becker et al. |
| 7,934,184 B2 | 4/2011 | Zhang |
| 7,939,443 B2 | 5/2011 | Fox et al. |
| 7,943,966 B2 | 5/2011 | Becker et al. |
| 7,943,967 B2 | 5/2011 | Becker et al. |
| 7,948,012 B2 | 5/2011 | Becker et al. |
| 7,948,013 B2 | 5/2011 | Becker et al. |
| 7,952,119 B2 | 5/2011 | Becker et al. |
| 7,956,421 B2 | 6/2011 | Becker |
| 7,958,465 B2 | 6/2011 | Lu et al. |
| 7,962,867 B2 | 6/2011 | White et al. |
| 7,962,879 B2 | 6/2011 | Tang et al. |
| 7,964,267 B1 | 6/2011 | Lyons et al. |
| 7,971,160 B2 | 6/2011 | Osawa et al. |
| 7,989,847 B2 | 8/2011 | Becker et al. |
| 7,989,848 B2 | 8/2011 | Becker et al. |
| 7,992,122 B1 | 8/2011 | Burstein et al. |
| 7,994,583 B2 | 8/2011 | Inaba |
| 8,004,042 B2 | 8/2011 | Yang et al. |
| 8,022,441 B2 | 9/2011 | Becker et al. |
| 8,030,689 B2 | 10/2011 | Becker et al. |
| 8,035,133 B2 | 10/2011 | Becker et al. |
| 8,044,437 B1 | 10/2011 | Venkatraman et al. |
| 8,058,671 B2 | 11/2011 | Becker et al. |
| 8,058,690 B2 | 11/2011 | Chang |
| 8,072,003 B2 | 12/2011 | Becker et al. |
| 8,072,053 B2 | 12/2011 | Li |
| 8,088,679 B2 | 1/2012 | Becker et al. |
| 8,088,680 B2 | 1/2012 | Becker et al. |
| 8,088,681 B2 | 1/2012 | Becker et al. |
| 8,088,682 B2 | 1/2012 | Becker et al. |
| 8,089,098 B2 | 1/2012 | Becker et al. |
| 8,089,099 B2 | 1/2012 | Becker et al. |
| 8,089,100 B2 | 1/2012 | Becker et al. |
| 8,089,101 B2 | 1/2012 | Becker et al. |
| 8,089,102 B2 | 1/2012 | Becker et al. |
| 8,089,103 B2 | 1/2012 | Becker et al. |
| 8,089,104 B2 | 1/2012 | Becker et al. |
| 8,101,975 B2 | 1/2012 | Becker et al. |
| 8,110,854 B2 | 2/2012 | Becker et al. |
| 8,129,750 B2 | 3/2012 | Becker et al. |
| 8,129,751 B2 | 3/2012 | Becker et al. |
| 8,129,752 B2 | 3/2012 | Becker et al. |
| 8,129,754 B2 | 3/2012 | Becker et al. |
| 8,129,755 B2 | 3/2012 | Becker et al. |
| 8,129,756 B2 | 3/2012 | Becker et al. |
| 8,129,757 B2 | 3/2012 | Becker et al. |
| 8,129,819 B2 | 3/2012 | Becker et al. |
| 8,130,529 B2 | 3/2012 | Tanaka |
| 8,134,183 B2 | 3/2012 | Becker et al. |
| 8,134,184 B2 | 3/2012 | Becker et al. |
| 8,134,185 B2 | 3/2012 | Becker et al. |
| 8,134,186 B2 | 3/2012 | Becker et al. |
| 8,138,525 B2 | 3/2012 | Becker et al. |
| 8,161,427 B2 | 4/2012 | Morgenshtein et al. |
| 8,178,905 B2 | 5/2012 | Toubou |
| 8,178,909 B2 | 5/2012 | Venkatraman et al. |
| 8,198,656 B2 | 6/2012 | Becker et al. |
| 8,207,053 B2 | 6/2012 | Becker et al. |
| 8,214,778 B2 | 7/2012 | Quandt et al. |
| 8,217,428 B2 | 7/2012 | Becker et al. |
| 8,225,239 B2 | 7/2012 | Reed et al. |
| 8,225,261 B2 | 7/2012 | Hong et al. |
| 8,245,180 B2 | 8/2012 | Smayling et al. |
| 8,247,846 B2 | 8/2012 | Becker |
| 8,253,172 B2 | 8/2012 | Becker et al. |
| 8,253,173 B2 | 8/2012 | Becker et al. |
| 8,258,547 B2 | 9/2012 | Becker et al. |
| 8,258,548 B2 | 9/2012 | Becker et al. |
| 8,258,549 B2 | 9/2012 | Becker et al. |
| 8,258,550 B2 | 9/2012 | Becker et al. |
| 8,258,551 B2 | 9/2012 | Becker et al. |
| 8,258,552 B2 | 9/2012 | Becker et al. |
| 8,258,581 B2 | 9/2012 | Becker |
| 8,264,007 B2 | 9/2012 | Becker et al. |
| 8,264,008 B2 | 9/2012 | Becker et al. |
| 8,264,009 B2 | 9/2012 | Becker et al. |
| 8,283,701 B2 | 10/2012 | Becker et al. |
| 8,294,212 B2 | 10/2012 | Wang et al. |
| 8,316,327 B2 | 11/2012 | Herold |
| 8,356,268 B2 | 1/2013 | Becker et al. |
| 8,378,407 B2 | 2/2013 | Audzeyeu et al. |
| 8,395,224 B2 | 3/2013 | Becker et al. |
| 8,402,397 B2 | 3/2013 | Robles et al. |
| 8,405,163 B2 | 3/2013 | Becker et al. |
| 8,422,274 B2 | 4/2013 | Tomita et al. |
| 8,436,400 B2 | 5/2013 | Becker et al. |
| 8,453,094 B2 | 5/2013 | Kornachuk et al. |
| 8,575,706 B2 | 11/2013 | Becker et al. |
| 8,667,443 B2 | 3/2014 | Smayling et al. |
| 8,701,071 B2 | 4/2014 | Kornachuk et al. |
| 8,735,995 B2 | 5/2014 | Becker et al. |
| 8,756,551 B2 | 6/2014 | Becker et al. |
| 8,836,045 B2 | 9/2014 | Becker et al. |
| 8,839,162 B2 | 9/2014 | Amundson et al. |
| 8,839,175 B2 | 9/2014 | Smayling et al. |
| 8,847,329 B2 | 9/2014 | Becker et al. |
| 8,863,063 B2 | 10/2014 | Becker et al. |
| 9,202,779 B2 | 12/2015 | Kornachuk et al. |
| 9,336,344 B2 | 5/2016 | Smayling |
| 2001/0049813 A1 | 12/2001 | Chan et al. |
| 2002/0003270 A1 | 1/2002 | Makino |
| 2002/0015899 A1 | 2/2002 | Chen et al. |
| 2002/0030510 A1 | 3/2002 | Kono et al. |
| 2002/0063582 A1 | 5/2002 | Rikino |
| 2002/0068423 A1 | 6/2002 | Park et al. |
| 2002/0079927 A1 | 6/2002 | Katoh et al. |
| 2002/0149392 A1 | 10/2002 | Cho |
| 2002/0166107 A1 | 11/2002 | Capodieci et al. |
| 2002/0194575 A1 | 12/2002 | Allen et al. |
| 2003/0042930 A1 | 3/2003 | Pileggi et al. |
| 2003/0046653 A1 | 3/2003 | Liu |
| 2003/0061592 A1 | 3/2003 | Agrawal et al. |
| 2003/0088839 A1 | 5/2003 | Watanabe |
| 2003/0088842 A1 | 5/2003 | Cirit |
| 2003/0103176 A1 | 6/2003 | Abe et al. |
| 2003/0106037 A1 | 6/2003 | Moniwa et al. |
| 2003/0117168 A1 | 6/2003 | Uneme et al. |
| 2003/0124847 A1 | 7/2003 | Houston et al. |
| 2003/0125917 A1 | 7/2003 | Rich et al. |
| 2003/0126569 A1 | 7/2003 | Rich et al. |
| 2003/0145288 A1 | 7/2003 | Wang et al. |
| 2003/0145299 A1 | 7/2003 | Fried et al. |
| 2003/0177465 A1 | 9/2003 | MacLean et al. |
| 2003/0185076 A1 | 10/2003 | Worley |
| 2003/0203287 A1 | 10/2003 | Miyagawa |
| 2003/0229868 A1 | 12/2003 | White et al. |
| 2003/0229875 A1 | 12/2003 | Smith et al. |
| 2004/0029372 A1 | 2/2004 | Jang et al. |
| 2004/0049754 A1 | 3/2004 | Liao et al. |
| 2004/0063038 A1 | 4/2004 | Shin et al. |
| 2004/0115539 A1 | 6/2004 | Broeke et al. |
| 2004/0139412 A1 | 7/2004 | Ito et al. |
| 2004/0145028 A1 | 7/2004 | Matsumoto et al. |
| 2004/0153979 A1 | 8/2004 | Chang |
| 2004/0161878 A1 | 8/2004 | Or-Bach et al. |
| 2004/0164360 A1 | 8/2004 | Nishida et al. |
| 2004/0169201 A1 | 9/2004 | Hidaka |
| 2004/0194050 A1 | 9/2004 | Hwang et al. |
| 2004/0196705 A1 | 10/2004 | Ishikura et al. |

(56) References Cited

U.S. PATENT DOCUMENTS

| | | |
|---|---|---|
| 2004/0229135 A1 | 11/2004 | Wang et al. |
| 2004/0232444 A1 | 11/2004 | Shimizu |
| 2004/0243966 A1 | 12/2004 | Dellinger |
| 2004/0262640 A1 | 12/2004 | Suga |
| 2005/0009312 A1 | 1/2005 | Butt et al. |
| 2005/0009344 A1 | 1/2005 | Hwang et al. |
| 2005/0012157 A1 | 1/2005 | Cho et al. |
| 2005/0044522 A1 | 2/2005 | Maeda |
| 2005/0055828 A1 | 3/2005 | Wang et al. |
| 2005/0076320 A1 | 4/2005 | Maeda |
| 2005/0087806 A1 | 4/2005 | Hokazono |
| 2005/0093147 A1 | 5/2005 | Tu |
| 2005/0101112 A1 | 5/2005 | Rueckes et al. |
| 2005/0110130 A1 | 5/2005 | Kitabayashi et al. |
| 2005/0135134 A1 | 6/2005 | Yen |
| 2005/0136340 A1 | 6/2005 | Baselmans et al. |
| 2005/0138598 A1 | 6/2005 | Kokubun |
| 2005/0156200 A1 | 7/2005 | Kinoshita |
| 2005/0185325 A1 | 8/2005 | Hur |
| 2005/0189604 A1 | 9/2005 | Gupta et al. |
| 2005/0189614 A1 | 9/2005 | Ihme et al. |
| 2005/0196685 A1 | 9/2005 | Wang et al. |
| 2005/0205894 A1 | 9/2005 | Sumikawa et al. |
| 2005/0212018 A1 | 9/2005 | Schoellkopf et al. |
| 2005/0224982 A1 | 10/2005 | Kemerling et al. |
| 2005/0229130 A1 | 10/2005 | Wu et al. |
| 2005/0251771 A1 | 11/2005 | Robles |
| 2005/0264320 A1 | 12/2005 | Chan et al. |
| 2005/0264324 A1 | 12/2005 | Nakazato |
| 2005/0266621 A1 | 12/2005 | Kim |
| 2005/0268256 A1 | 12/2005 | Tsai et al. |
| 2005/0278673 A1 | 12/2005 | Kawachi |
| 2005/0280031 A1 | 12/2005 | Yano |
| 2006/0038234 A1 | 2/2006 | Liaw |
| 2006/0063334 A1 | 3/2006 | Donze et al. |
| 2006/0070018 A1 | 3/2006 | Semmler |
| 2006/0084261 A1 | 4/2006 | Iwaki |
| 2006/0091550 A1 | 5/2006 | Shimazaki et al. |
| 2006/0095872 A1 | 5/2006 | McElvain |
| 2006/0101370 A1 | 5/2006 | Cui et al. |
| 2006/0112355 A1 | 5/2006 | Pileggi et al. |
| 2006/0113533 A1 | 6/2006 | Tamaki et al. |
| 2006/0113567 A1 | 6/2006 | Ohmori et al. |
| 2006/0120143 A1 | 6/2006 | Liaw |
| 2006/0121715 A1 | 6/2006 | Chang et al. |
| 2006/0123376 A1 | 6/2006 | Vogel et al. |
| 2006/0125024 A1 | 6/2006 | Ishigaki |
| 2006/0131609 A1 | 6/2006 | Kinoshita et al. |
| 2006/0136848 A1 | 6/2006 | Ichiryu et al. |
| 2006/0146638 A1 | 7/2006 | Chang et al. |
| 2006/0151810 A1 | 7/2006 | Ohshige |
| 2006/0158270 A1 | 7/2006 | Gibet et al. |
| 2006/0177744 A1 | 8/2006 | Bodendorf et al. |
| 2006/0181310 A1 | 8/2006 | Rhee |
| 2006/0195809 A1 | 8/2006 | Cohn et al. |
| 2006/0195810 A1 | 8/2006 | Morton |
| 2006/0197557 A1 | 9/2006 | Chung |
| 2006/0206854 A1 | 9/2006 | Barnes et al. |
| 2006/0223302 A1 | 10/2006 | Chang et al. |
| 2006/0248495 A1 | 11/2006 | Sezginer |
| 2006/0261417 A1 | 11/2006 | Suzuki |
| 2006/0277521 A1 | 12/2006 | Chen |
| 2007/0001304 A1 | 1/2007 | Liaw |
| 2007/0002617 A1 | 1/2007 | Houston |
| 2007/0004147 A1 | 1/2007 | Toubou |
| 2007/0007574 A1 | 1/2007 | Ohsawa |
| 2007/0038973 A1 | 2/2007 | Li et al. |
| 2007/0074145 A1 | 3/2007 | Tanaka |
| 2007/0094634 A1 | 4/2007 | Seizginer et al. |
| 2007/0101305 A1 | 5/2007 | Smith et al. |
| 2007/0105023 A1 | 5/2007 | Zhou et al. |
| 2007/0106971 A1 | 5/2007 | Lien et al. |
| 2007/0113216 A1 | 5/2007 | Zhang |
| 2007/0172770 A1 | 7/2007 | Witters et al. |
| 2007/0186196 A1 | 8/2007 | Tanaka |
| 2007/0196958 A1 | 8/2007 | Bhattacharya et al. |
| 2007/0209029 A1 | 9/2007 | Ivonin et al. |
| 2007/0210391 A1* | 9/2007 | Becker et al. ................ 257/390 |
| 2007/0234252 A1 | 10/2007 | Visweswariah et al. |
| 2007/0234262 A1 | 10/2007 | Uedi et al. |
| 2007/0241810 A1 | 10/2007 | Onda |
| 2007/0256039 A1 | 11/2007 | White |
| 2007/0257277 A1 | 11/2007 | Takeda et al. |
| 2007/0264758 A1 | 11/2007 | Correale |
| 2007/0274140 A1 | 11/2007 | Joshi et al. |
| 2007/0277129 A1 | 11/2007 | Allen et al. |
| 2007/0288882 A1 | 12/2007 | Kniffin et al. |
| 2007/0290361 A1 | 12/2007 | Chen |
| 2007/0294652 A1 | 12/2007 | Bowen |
| 2007/0297249 A1 | 12/2007 | Chang et al. |
| 2008/0001176 A1 | 1/2008 | Gopalakrishnan |
| 2008/0005712 A1 | 1/2008 | Charlebois et al. |
| 2008/0021689 A1 | 1/2008 | Yamashita et al. |
| 2008/0022247 A1 | 1/2008 | Kojima et al. |
| 2008/0046846 A1 | 2/2008 | Chew et al. |
| 2008/0081472 A1 | 4/2008 | Tanaka |
| 2008/0082952 A1 | 4/2008 | O'Brien |
| 2008/0086712 A1 | 4/2008 | Fujimoto |
| 2008/0097641 A1 | 4/2008 | Miyashita et al. |
| 2008/0098334 A1 | 4/2008 | Pileggi et al. |
| 2008/0098341 A1 | 4/2008 | Kobayashi et al. |
| 2008/0099795 A1 | 5/2008 | Bernstein et al. |
| 2008/0127000 A1 | 5/2008 | Majumder et al. |
| 2008/0127029 A1 | 5/2008 | Graur et al. |
| 2008/0134128 A1 | 6/2008 | Blatchford et al. |
| 2008/0144361 A1 | 6/2008 | Wong |
| 2008/0148216 A1 | 6/2008 | Chan et al. |
| 2008/0163141 A1 | 7/2008 | Scheffer et al. |
| 2008/0168406 A1 | 7/2008 | Rahmat et al. |
| 2008/0211028 A1 | 9/2008 | Suzuki |
| 2008/0216207 A1 | 9/2008 | Tsai |
| 2008/0244494 A1 | 10/2008 | McCullen |
| 2008/0251779 A1 | 10/2008 | Kakoschke et al. |
| 2008/0265290 A1 | 10/2008 | Nielsen et al. |
| 2008/0276105 A1 | 11/2008 | Hoberman et al. |
| 2008/0283910 A1 | 11/2008 | Dreeskornfeld et al. |
| 2008/0285331 A1 | 11/2008 | Torok et al. |
| 2008/0308848 A1 | 12/2008 | Inaba |
| 2008/0308880 A1 | 12/2008 | Inaba |
| 2008/0315258 A1 | 12/2008 | Masuda et al. |
| 2009/0014811 A1 | 1/2009 | Becker et al. |
| 2009/0024974 A1 | 1/2009 | Yamada |
| 2009/0031261 A1 | 1/2009 | Smith et al. |
| 2009/0032898 A1 | 2/2009 | Becker et al. |
| 2009/0032967 A1 | 2/2009 | Becker et al. |
| 2009/0037864 A1 | 2/2009 | Becker et al. |
| 2009/0057780 A1 | 3/2009 | Wong et al. |
| 2009/0075485 A1 | 3/2009 | Ban et al. |
| 2009/0077524 A1 | 3/2009 | Nagamura et al. |
| 2009/0085067 A1 | 4/2009 | Hayashi et al. |
| 2009/0087991 A1 | 4/2009 | Yatsuda et al. |
| 2009/0101940 A1 | 4/2009 | Barrows et al. |
| 2009/0106714 A1 | 4/2009 | Culp et al. |
| 2009/0155990 A1 | 6/2009 | Yanagidaira et al. |
| 2009/0181314 A1 | 7/2009 | Shyu et al. |
| 2009/0187871 A1 | 7/2009 | Cork |
| 2009/0206443 A1 | 8/2009 | Juengling |
| 2009/0224408 A1 | 9/2009 | Fox |
| 2009/0228853 A1 | 9/2009 | Hong et al. |
| 2009/0228857 A1 | 9/2009 | Kornachuk et al. |
| 2009/0235215 A1 | 9/2009 | Lavin |
| 2009/0273100 A1 | 11/2009 | Aton et al. |
| 2009/0280582 A1 | 11/2009 | Thijs et al. |
| 2009/0302372 A1 | 12/2009 | Chang et al. |
| 2009/0319977 A1 | 12/2009 | Saxena et al. |
| 2010/0001321 A1 | 1/2010 | Becker et al. |
| 2010/0006897 A1 | 1/2010 | Becker et al. |
| 2010/0006898 A1 | 1/2010 | Becker et al. |
| 2010/0006899 A1 | 1/2010 | Becker et al. |
| 2010/0006900 A1 | 1/2010 | Becker et al. |
| 2010/0006901 A1 | 1/2010 | Becker et al. |
| 2010/0006902 A1 | 1/2010 | Becker et al. |
| 2010/0006903 A1 | 1/2010 | Becker et al. |
| 2010/0006947 A1 | 1/2010 | Becker et al. |

(56) References Cited

U.S. PATENT DOCUMENTS

| | | |
|---|---|---|
| 2010/0006948 A1 | 1/2010 | Becker et al. |
| 2010/0006950 A1 | 1/2010 | Becker et al. |
| 2010/0006951 A1 | 1/2010 | Becker et al. |
| 2010/0006986 A1 | 1/2010 | Becker et al. |
| 2010/0011327 A1 | 1/2010 | Becker et al. |
| 2010/0011328 A1 | 1/2010 | Becker et al. |
| 2010/0011329 A1 | 1/2010 | Becker et al. |
| 2010/0011330 A1 | 1/2010 | Becker et al. |
| 2010/0011331 A1 | 1/2010 | Becker et al. |
| 2010/0011332 A1 | 1/2010 | Becker et al. |
| 2010/0011333 A1 | 1/2010 | Becker et al. |
| 2010/0012981 A1 | 1/2010 | Becker et al. |
| 2010/0012982 A1 | 1/2010 | Becker et al. |
| 2010/0012983 A1 | 1/2010 | Becker et al. |
| 2010/0012984 A1 | 1/2010 | Becker et al. |
| 2010/0012985 A1 | 1/2010 | Becker et al. |
| 2010/0012986 A1 | 1/2010 | Becker et al. |
| 2010/0017766 A1 | 1/2010 | Becker et al. |
| 2010/0017767 A1 | 1/2010 | Becker et al. |
| 2010/0017768 A1 | 1/2010 | Becker et al. |
| 2010/0017769 A1 | 1/2010 | Becker et al. |
| 2010/0017770 A1 | 1/2010 | Becker et al. |
| 2010/0017771 A1 | 1/2010 | Becker et al. |
| 2010/0017772 A1 | 1/2010 | Becker et al. |
| 2010/0019280 A1 | 1/2010 | Becker et al. |
| 2010/0019281 A1 | 1/2010 | Becker et al. |
| 2010/0019282 A1 | 1/2010 | Becker et al. |
| 2010/0019283 A1 | 1/2010 | Becker et al. |
| 2010/0019284 A1 | 1/2010 | Becker et al. |
| 2010/0019285 A1 | 1/2010 | Becker et al. |
| 2010/0019286 A1 | 1/2010 | Becker et al. |
| 2010/0019287 A1 | 1/2010 | Becker et al. |
| 2010/0019288 A1 | 1/2010 | Becker et al. |
| 2010/0019308 A1 | 1/2010 | Chan et al. |
| 2010/0023906 A1 | 1/2010 | Becker et al. |
| 2010/0023907 A1 | 1/2010 | Becker et al. |
| 2010/0023908 A1 | 1/2010 | Becker et al. |
| 2010/0023911 A1 | 1/2010 | Becker et al. |
| 2010/0025731 A1 | 2/2010 | Becker et al. |
| 2010/0025732 A1 | 2/2010 | Becker et al. |
| 2010/0025733 A1 | 2/2010 | Becker et al. |
| 2010/0025734 A1 | 2/2010 | Becker et al. |
| 2010/0025735 A1 | 2/2010 | Becker et al. |
| 2010/0025736 A1 | 2/2010 | Becker et al. |
| 2010/0032722 A1 | 2/2010 | Becker et al. |
| 2010/0032723 A1 | 2/2010 | Becker et al. |
| 2010/0032724 A1 | 2/2010 | Becker et al. |
| 2010/0032726 A1 | 2/2010 | Becker et al. |
| 2010/0037194 A1 | 2/2010 | Becker et al. |
| 2010/0037195 A1 | 2/2010 | Becker et al. |
| 2010/0096671 A1 | 4/2010 | Becker et al. |
| 2010/0115484 A1 | 5/2010 | Frederick |
| 2010/0203689 A1 | 8/2010 | Bernstein et al. |
| 2010/0224943 A1 | 9/2010 | Kawasaki |
| 2010/0229140 A1 | 9/2010 | Strolenberg et al. |
| 2010/0232212 A1 | 9/2010 | Anderson et al. |
| 2010/0252865 A1 | 10/2010 | Van Der Zanden |
| 2010/0252896 A1 | 10/2010 | Smayling |
| 2010/0264468 A1 | 10/2010 | Xu |
| 2010/0270681 A1 | 10/2010 | Bird et al. |
| 2010/0287518 A1 | 11/2010 | Becker |
| 2010/0301482 A1 | 12/2010 | Schultz et al. |
| 2011/0016909 A1 | 1/2011 | Mirza et al. |
| 2011/0108890 A1 | 5/2011 | Becker et al. |
| 2011/0108891 A1 | 5/2011 | Becker et al. |
| 2011/0154281 A1 | 6/2011 | Zach |
| 2011/0207298 A1 | 8/2011 | Anderson et al. |
| 2011/0260253 A1 | 10/2011 | Inaba |
| 2011/0298025 A1 | 12/2011 | Haensch et al. |
| 2011/0317477 A1 | 12/2011 | Liaw |
| 2012/0012932 A1 | 1/2012 | Perng et al. |
| 2012/0118854 A1 | 5/2012 | Smayling |
| 2012/0273841 A1 | 11/2012 | Quandt et al. |
| 2013/0097574 A1 | 4/2013 | Balabanov et al. |
| 2013/0200465 A1 | 8/2013 | Becker et al. |
| 2013/0200469 A1 | 8/2013 | Becker et al. |
| 2013/0207198 A1 | 8/2013 | Becker et al. |
| 2013/0207199 A1 | 8/2013 | Becker et al. |
| 2013/0254732 A1 | 9/2013 | Kornachuk et al. |
| 2014/0197543 A1 | 7/2014 | Kornachuk et al. |
| 2015/0249041 A1 | 9/2015 | Becker et al. |
| 2015/0270218 A1 | 9/2015 | Becker et al. |
| 2016/0079159 A1 | 3/2016 | Kornachuk et al. |

FOREIGN PATENT DOCUMENTS

| | | |
|---|---|---|
| EP | 1394858 | 3/2004 |
| EP | 1670062 | 6/2006 |
| EP | 1833091 | 8/2007 |
| EP | 1730777 | 9/2007 |
| EP | 2251901 | 11/2010 |
| FR | 2860920 | 4/2005 |
| JP | 58-182242 | 10/1983 |
| JP | 58 215827 A | 12/1983 |
| JP | 61-182244 | 8/1986 |
| JP | S63-310136 A | 12/1988 |
| JP | H01284115 | 11/1989 |
| JP | 03-165061 | 7/1991 |
| JP | H05152937 A | 6/1993 |
| JP | H05211437 | 8/1993 |
| JP | H05218362 | 8/1993 |
| JP | H07-153927 A | 6/1995 |
| JP | 2684980 | 7/1995 |
| JP | 1995-302706 | 11/1995 |
| JP | 1997-09289251 A | 11/1997 |
| JP | 10-116911 | 5/1998 |
| JP | 1999-045948 | 2/1999 |
| JP | 2001-068558 | 3/2001 |
| JP | 2001-168707 | 6/2001 |
| JP | 2002-026125 | 1/2002 |
| JP | 2002-026296 A | 1/2002 |
| JP | 2002-184870 A | 6/2002 |
| JP | 2001-056463 | 9/2002 |
| JP | 2002-258463 | 9/2002 |
| JP | 2002-289703 | 10/2002 |
| JP | 2001-272228 | 3/2003 |
| JP | 2003-100872 | 4/2003 |
| JP | 2003-264231 | 9/2003 |
| JP | 2004-013920 | 1/2004 |
| JP | 2004-200300 | 7/2004 |
| JP | 2004-241529 | 8/2004 |
| JP | 2004-342757 A | 12/2004 |
| JP | 2005-020008 | 1/2005 |
| JP | 2003-359375 | 5/2005 |
| JP | 2005-135971 A | 5/2005 |
| JP | 2005-149265 | 6/2005 |
| JP | 2005-183793 | 7/2005 |
| JP | 2005-203447 | 7/2005 |
| JP | 2005-268610 | 9/2005 |
| JP | 2006-073696 | 3/2006 |
| JP | 2005-114752 | 10/2006 |
| JP | 2006-303022 A | 11/2006 |
| JP | 2007-012855 | 1/2007 |
| JP | 2007-013060 | 1/2007 |
| JP | 2007-043049 | 2/2007 |
| JP | 2007-141971 | 6/2007 |
| JP | 2011-515841 | 5/2011 |
| KR | 10-1998-087485 | 12/1969 |
| KR | 10-0417093 | 6/1997 |
| KR | 1998-0084215 A | 12/1998 |
| KR | 10-1999-0057943 A | 7/1999 |
| KR | 2000-0005660 | 1/2000 |
| KR | 10-2000-0028830 A | 5/2000 |
| KR | 10-2002-0034313 | 5/2002 |
| KR | 10-2002-0070777 | 9/2002 |
| KR | 2003-0022006 | 3/2003 |
| KR | 2004-0005609 | 1/2004 |
| KR | 10-2005-0030347 A | 3/2005 |
| KR | 2005-0037965 A | 4/2005 |
| KR | 2006-0108233 A | 10/2006 |
| TW | 386288 | 4/2000 |
| TW | 200709309 | 3/2007 |
| TW | 200709565 | 3/2007 |
| TW | 200811704 A | 3/2008 |

(56) References Cited

FOREIGN PATENT DOCUMENTS

| TW | 200947567 A | 11/2009 |
|---|---|---|
| WO | WO 2005/104356 | 11/2005 |
| WO | WO 2006/014849 | 2/2006 |
| WO | WO 2006/052738 | 5/2006 |
| WO | WO 2006/090445 | 8/2006 |
| WO | WO 2007/014053 | 2/2007 |
| WO | WO 2007/103587 | 9/2007 |

OTHER PUBLICATIONS

U.S. Appl. No. 60/625,342, Pileggi et al., filed May 25, 2006.
Acar, et al., "A Linear-Centric Simulation Framework for Parametric Fluctuations", 2002, IEEE, Carnegie Mellon University USA, pp. 1-8, Jan. 28, 2002.
Amazawa, et al., "Fully Planarized Four-Level Interconnection with Stacked VLAS Using CMP of Selective CVD-Al and Insulator and its Application to Quarter Micron Gate Array LSIs", 1995, IEEE, Japan, pp. 473-476, Dec. 10, 1995.
Axelrad et al. "Efficient Full-Chip Yield Analysis Methodology for OPC-Corrected VLSI Design", 2000, International Symposium on Quality Electronic Design (ISQED), Mar. 20, 2000.
Balasinski et al. "Impact of Subwavelength CD Tolerance on Device Performance", 2002, SPIE vol. 4692, Jul. 11, 2002.
Burkhardt, et al., "Dark Field Double Dipole Lithography (DDL) for Back-End-Of-Line Processes", 2007, SPIE Proceeding Series, vol. 6520; Mar. 26, 2007.
Capetti, et al., "Sub k1=0.25 Lithography with Double Patterning Technique for 45nm Technology Node Flash Memory Devices at $\lambda$=193nm", 2007, SPIE Proceeding Series, vol. 6520; Mar. 27, 2007.
Capodieci, L., et al., "Toward a Methodology for Manufacturability-Driven Design Rule Exploration," DAC 2004, Jun. 7, 2004, San Diego, CA.
Chandra, et al., "An Interconnect Channel Design Methodology for High Performance Integrated Circuits", 2004, IEEE, Carnegie Mellon University, pp. 1-6, Feb. 16, 2004.
Cheng, et al., "Feasibility Study of Splitting Pitch Technology on 45nm Contact Patterning with 0.93 NA", 2007, SPIE Proceeding Series, vol. 6520; Feb. 25, 2007.
Chow, et al., "The Design of a SRAM-Based Field-Programmable Gate Array—Part II: Circuit Design and Layout", 1999, IEEE, vol. 7 # 3 pp. 321-330, Sep. 1, 1999.
Clark et al. "Managing Standby and Active Mode Leakage Power in Deep Sub-Micron Design", Aug. 9, 2004, ACM.
Cobb et al. "Using OPC to Optimize for Image Slope and Improve Process Window", 2003, SPIE vol. 5130, Apr. 16, 2003.
Devgan "Leakage Issues in IC Design: Part 3", 2003, ICCAD, Nov. 9, 2003.
DeVor, et al., "Statistical Quality Design and Control", 1992, Macmillan Publishing Company, pp. 264-267, Jan. 3, 1992.
Dictionary.com, "channel," in Collins English Dictionary—Complete & Unabridged 10th Edition. Source location: HarperCollins Publishers. Sep. 3, 2009.
Dusa, et al. "Pitch Doubling Through Dual Patterning Lithography Challenges in Integration and Litho Budgets", 2007, SPIE Proceeding Series, vol. 6520; Feb. 25, 2007.
El-Gamal, "Fast, Cheap and Under Control: The Next Implementation Fabric", Jun. 2, 2003, ACM Press, pp. 354-355.
Firedberg, et al., "Modeling Within-Field Gate Length Spatial Variation for Process-Design Co-Optimization," 2005 Proc. of SPIE vol. 5756, pp. 178-188, Feb. 27, 2005.
Frankel, "Quantum State Control Interference Lithography and Trim Double Patterning for 32-16nm Lithography", 2007, SPIE Proceeding Series, vol. 6520; Feb. 27, 2007.
Garg, et al. "Lithography Driven Layout Design", 2005, IEEE VLSI Design 2005, Jan. 3, 2005.
Grobman et al. "Reticle Enhancement Technology Trends: Resource and Manufacturability Implications for the Implementation of Physical Designs" Apr. 1, 2001, ACM.
Grobman et al. "Reticle Enhancement Technology. Implications and Challenges for Physical Design" Jun. 18, 2001, ACM.
Gupta et al. "Enhanced Resist and Etch CD Control by Design Perturbation", Oct. 4, 2006, Society of Photo-Optical Instrumentation Engineers.
Gupta et al. "A Practical Transistor-Level Dual Threshold Voltage Assignment Methodology", 2005, Sixth International Symposium on Quality Electronic Design (ISQED), Mar. 21, 2005.
Gupta et al. "Detailed Placement for Improved Depth of Focus and CD Control", 2005, ACM, Jan. 18, 2005.
Gupta et al. "Joining the Design and Mask Flows for Better and Cheaper Masks", Oct. 14, 2004, Society of Photo-Optical Instrumentation Engineers.
Gupta et al. "Manufacturing-Aware Physical Design", ICCAD 2003, Nov. 9, 2003.
Gupta et al. "Selective Gate-Length Biasing for Cost-Effective Runtime Leakage Control", Jun. 7, 2004, ACM.
Gupta et al. "Wafer Topography-Aware Optical Proximity Correction for Better DOF Margin and CD Control", Apr. 13, 2005, SPIE.
Gupta, Puneet, et al., "Manufacturing-aware Design Methodology for Assist Feature Correctness," SPIE vol. 5756, May 13, 2005.
Ha et al., "Reduction in the Mask Error Factor by Optimizing the Diffraction Order of a Scattering Bar in Lithography," Journal of the Korean Physical Society, vol. 46, No. 5, May 5, 2005, pp. 1213-1217.
Hakko, et al., "Extension of the 2D-TCC Technique to Optimize Mask Pattern Layouts," 2008 Proc. of SPIE vol. 7028, 11 pages, Apr. 16, 2008.
Halpin et al., "Detailed Placement with Net Length Constraints," Publication Year 2003, Proceedings of the 3rd IEEE International Workshop on System-on-Chip for Real-Time Applications, pp. 22-27, Jun. 30, 2003.
Hayashida, et al., "Manufacturable Local Interconnect technology Fully Compatible with Titanium Salicide Process", Jun. 11, 1991, VMIC Conference.
Heng, et al., "A VLSI Artwork Legalization Technique Base on a New Criterion of Minimum Layout Perturbation", Proceedings of 1997 International Symposium on Physical Design, pp. 116-121, Apr. 14, 1997.
Heng, et al., "Toward Through-Process Layout Quality Metrics", Mar. 3, 2005, Society of Photo-Optical Instrumentation Engineers.
Hu, et al., "Synthesis and Placement Flow for Gain-Based Programmable Regular Fabrics", Apr. 6, 2003, ACM Press, pp. 197-203.
Hur et al., "Mongrel: Hybrid Techniques for Standard Cell Placement," Publication Year 2000, IEEE/ACM International Conference on Computer Aided Design, ICCAD-2000, pp. 165-170, Nov. 5, 2000.
Hutton, et al., "A Methodology for FPGA to Structured-ASIC Synthesis and Verification", 2006, EDAA, pp. 64-69, Mar. 6, 2006.
Intel Core Microarchitecture White Paper "Introducing the 45 nm Next-Generation Intel Core Microarchitecture," Intel Corporation, 2007 (best available publication date).
Jayakumar, et al., "A Metal and VIA Maskset Programmable VLSI Design Methodology using PLAs", 2004, IEEE, pp. 590-594, Nov. 7, 2004.
Jhaveri, T. et al., Maximization of Layout Printability/Manufacturability by Extreme Layout Regularity, Proc. of the SPIE vol. 6156, Feb. 19, 2006.
Kang, S.M., Metal-Metal Matrix (M3) for High-Speed MOS VLSI Layout, IEEE Trans. on CAD, vol. CAD-6, No. 5, Sep. 1, 1987.
Kawashima, et al., "Mask Optimization for Arbitrary Patterns with 2D-TCC Resolution Enhancement Technique," 2008 Proc. of SPIE vol. 6924, 12 pages, Feb. 24, 2008.
Kheterpal, et al., "Design Methodology for IC Manufacturability Based on Regular Logic-Bricks", DAC, Jun. 13, 2005, IEEE/AMC, vol. 6520.
Kheterpal, et al., "Routing Architecture Exploration for Regular Fabrics", DAC, Jun. 7, 2004, ACM Press, pp. 204-207.
Kim, et al., "Double Exposure Using 193nm Negative Tone Photoresist", 2007, SPIE Proceeding Series, vol. 6520; Feb. 25, 2007.

(56) References Cited

OTHER PUBLICATIONS

Kim, et al., "Issues and Challenges of Double Patterning Lithography in DRAM", 2007, SPIE Proceeding Series, vol. 6520; Feb. 25, 2007.
Koorapaty, et al., "Exploring Logic Block Granularity for Regular Fabrics", 2004, IEEE, pp. 1-6, Feb. 16, 2004.
Koorapaty, et al., "Heterogeneous Logic Block Architectures for Via-Patterned Programmable Fabric", 13th International Conference on Field Programmable Logic and Applications (FPL) 2003, Lecture Notes in Computer Science (LNCS), Sep. 1, 2003, Springer-Verlag, vol. 2778, pp. 426-436.
Koorapaty, et al., "Modular, Fabric-Specific Synthesis for Programmable Architectures", 12th International Conference on Field Programmable Logic and Applications (FPL_2002, Lecture Notes in Computer Science (LNCS)), Sep. 2, 2002, Springer-Verlag, vol. 2438 pp. 132-141.
Kuh et al., "Recent Advances in VLSI Layout," Proceedings of the IEEE, vol. 78, Issue 2, pp. 237-263, Feb. 1, 1990.
Lavin et al. "Backend DAC Flows for "Restrictive Design Rules"", 2004, IEEE, Nov. 7, 2004.
Li, et al., "A Linear-Centric Modeling Approach to Harmonic Balance Analysis", 2002, IEEE, pp. 1-6, Mar. 4, 2002.
Li, et al., "Nonlinear Distortion Analysis Via Linear-Centric Models", 2003, IEEE, pp. 897-903, Jan. 21, 2003.
Liebmann et al., "Integrating DfM Components into a Cohesive Design-to-Silicon Solution," Proc. SPIE 5756, Design and Process Integration for Microelectronic Manufacturing III, Feb. 27, 2005.
Liebmann et al., "Optimizing Style Options for Sub-Resolution Assist Features," Proc. of SPIE vol. 4346, Feb. 25, 2001, pp. 141-152.
Liebmann, et al., "High-Performance Circuit Design for the RET-Enabled 65nm Technology Node", Feb. 26, 2004, SPIE Proceeding Series, vol. 5379 pp. 20-29.
Liebmann, L. W., Layout Impact of Resolution Enhancement Techniques: Impediment or Opportunity?, International Symposium on Physical Design, Apr. 6, 2003.
Liu et al., "Double Patterning with Multilayer Hard Mask Shrinkage for Sub 0.25 kl Lithography," Proc. SPIE 6520, Optical Microlithography XX, Feb. 25, 2007.
Mansfield et al., "Lithographic Comparison of Assist Feature Design Strategies," Proc. of SPIE vol. 4000, Feb. 27, 2000, pp. 63-76.
Miller, "Manufacturing-Aware Design Helps Boost IC Yield", Sep. 9, 2004, http://www.eetimes.com/showArticle.jhtml?articleID=47102054.
Mishra, P., et al., "FinFET Circuit Design," Nanoelectronic Circuit Design, pp. 23-54, Dec. 21, 2010.
Mo, et al., "Checkerboard: A Regular Structure and its Synthesis, International Workshop on Logic and Synthesis", Department of Electrical Engineering and Computer Sciences, UC Berkeley, California, pp. 1-7, Jun. 1, 2003.
Mo, et al., "PLA-Based Regular Structures and Their Synthesis", Department of Electrical Engineering and Computer Sciences, IEEE, pp. 723-729, Jun. 1, 2003.
Mo, et al., "Regular Fabrics in Deep Sub-Micron Integrated-Circuit Design", Kluwer Academic Publishers, Entire Book, Jun. 1, 2002.
Moore, Samuel K., "Intel 45-nanometer Penryn Processors Arrive," Nov. 13, 2007, IEEE Spectrum, http://spectrum.ieee.org/semiconductors/design/intel-45nanometer-penryn-processors-arrive.
Mutoh et al. "1-V Power Supply High-Speed Digital Circuit Technology with Multithreshold-Voltage CMOS", 1995, IEEE, Aug. 1, 1995.
Op de Beek, et al., "Manufacturability issues with Double Patterning for 50nm half pitch damascene applications, using RELACS® shrink and corresponding OPC", 2007, SPIE Proceeding Series, vol. 6520; Feb. 25, 2007.
Or-Bach, "Programmable Circuit Fabrics", Sep. 18, 2001, e-ASIC, pp. 1-36.
Otten, et al., "Planning for Performance", DAC 1998, ACM Inc., pp. 122-127, Jun. 15, 1998.

Pack et al. "Physical & Timing Verification of Subwavelength-Scale Designs—Part I: Lithography Impact on MOSFETs", 2003, SPIE vol. 5042, Feb. 23, 2003.
Pandini, et al., "Congestion-Aware Logic Synthesis", 2002, IEEE, pp. 1-8, Mar. 4, 2002.
Pandini, et al., "Understanding and Addressing the Impact of Wiring Congestion During Technology Mapping", ISPD Apr. 7, 2002, ACM Press, pp. 131-136.
Patel, et al., "An Architectural Exploration of Via Patterned Gate Arrays, ISPD 2003", Apr. 6, 2003, pp. 184-189.
Pham, D., et al., "FINFET Device Junction Formation Challenges," 2006 International Workshop on Junction Technology, pp. 73-77, Aug. 1, 2006.
Pileggi, et al., "Exploring Regular Fabrics to Optimize the Performance-Cost Trade-Offs, Proceedings of the 40th ACM/IEEE Design Automation Conference (DAC) 2003", Jun. 2, 2003, ACM Press, pp. 782-787.
Poonawala, et al., "ILT for Double Exposure Lithography with Conventional and Novel Materials", 2007, SPIE Proceeding Series, vol. 6520; Feb. 25, 2007.
Qian et al. "Advanced Physical Models for Mask Data Verification and Impacts on Physical Layout Synthesis" 2003 IEEE, Mar. 24, 2003.
Ran, et al., "An Integrated Design Flow for a Via-Configurable Gate Array", 2004, IEEE, pp. 582-589, Nov. 7, 2004.
Ran, et al., "Designing a Via-Configurable Regular Fabric", Custom Integrated Circuits Conference (CICC). Proceedings of the IEEE, Oct. 1, 2004, pp. 423-426.
Ran, et al., "On Designing Via-Configurable Cell Blocks for Regular Fabrics" Proceedings of the Design Automation Conference (DAC) 2004, Jun. 7, 2004, ACM Press, s 198-203.
Ran, et al., "The Magic of a Via-Configurable Regular Fabric", Proceedings of the IEEE International Conference on Computer Design (ICCD) Oct. 11, 2004.
Ran, et al., "Via-Configurable Routing Architectures and Fast Design Mappability Estimation for Regular Fabrics", 2005, IEEE, pp. 25-32, Sep. 1, 2006.
Reis, et al., "Physical Design Methodologies for Performance Predictability and Manufacturability", Apr. 14, 2004, ACM Press, pp. 390-397.
Robertson, et al., "The Modeling of Double Patterning Lithographic Processes", 2007, SPIE Proceeding Series, vol. 6520; Feb. 25, 2007.
Rosenbluth, et al., "Optimum Mask and Source Patterns to Print a Given Shape," 2001 Proc. of SPIE vol. 4346, pp. 486-502, Feb. 25, 2001.
Rovner, "Design for Manufacturability in Via Programmable Gate Arrays", May 1, 2003, Graduate School of Carnegie Mellon University.
Sengupta, "An Integrated CAD Framework Linking VLSI Layout Editors and Process Simulators", 1998, Thesis for Rice University, pp. 1-101, Nov. 1, 1998.
Sengupta, et al., "An Integrated CAD Framework Linking VLSI Layout Editors and Process Simulators", 1996, SPIE Proceeding Series, vol. 2726; pp. 244-252, Mar. 10, 1996.
Sherlekar, "Design Considerations for Regular Fabrics", Apr. 18, 2004, ACM Press, pp. 97-102.
Shi et al., "Understanding the Forbidden Pitch and Assist Feature Placement," Proc. of SPIE vol. 4562, pp. 968-979, Mar. 11, 2002.
Smayling et al., "APF Pitch Halving for 22 nm Logic Cells Using Gridded Design Rules," Proceedings of SPIE, USA, vol. 6925, Jan. 1, 2008, pp. 69251E-1-69251E-7.
Socha, et al., "Simultaneous Source Mask Optimization (SMO)," 2005 Proc. of SPIE vol. 5853, pp. 180-193, Apr. 13, 2005.
Sreedhar et al. "Statistical Yield Modeling for Sub-Wavelength Lithography", 2008 IEEE, Oct. 28, 2008.
Stapper, "Modeling of Defects in Integrated Circuit Photolithographic Patterns", Jul. 1, 1984, IBM, vol. 28 # 4, pp. 461-475.
Taylor, et al., "Enabling Energy Efficiency in Via-Patterned Gate Array Devices", Jun. 7, 2004, ACM Press, pp. 874-877.
Tian et al. "Model-Based Dummy Feature Placement for Oxide Chemical_Mechanical Polishing Manufacturability" IEEE, vol. 20, Issue 7, Jul. 1, 2001.

(56) References Cited

OTHER PUBLICATIONS

Tong, et al., "Regular Logic Fabrics for a Via Patterned Gate Array (VPGA), Custom Integrated Circuits Conference", Sep. 21, 2003, Proceedings of the IEEE, pp. 53-56.
Vanleenhove, et al., "A Litho-Only Approach to Double Patterning", 2007, SPIE Proceeding Series, vol. 6520; Feb. 25, 2007.
Wang, et al., "Performance Optimization for Gridded-Layout Standard Cells", vol. 5567 SPIE, Sep. 13, 2004.
Wang, J. et al., Standard Cell Layout with Regular Contact Placement, IEEE Trans. on Semicon. Mfg., vol. 17, No. 3, Aug. 9, 2004.
Webb, Clair, "45nm Design for Manufacturing," Intel Technology Journal, vol. 12, Issue 02, Jun. 17, 2008, ISSN 1535-864X, pp. 121-130.
Webb, Clair, "Layout Rule Trends and Affect upon CPU Design", vol. 6156 SPIE, Feb. 19, 2006.
Wenren, et al., "The Improvement of Photolithographic Fidelity of Two-dimensional Structures Though Double Exposure Method", 2007, SPIE Proceeding Series, vol. 6520; Feb. 25, 2007.
Wilcox, et al., "Design for Manufacturability: A Key to Semiconductor Manufacturing Excellence", 1998 IEEE, pp. 308-313, Sep. 23, 1998.
Wong, et al., "Resolution Enhancement Techniques and Design for Manufacturability: Containing and Accounting for Variabilities in Integrated Circuit Creation," J. Micro/Nanolith. MEMS MOEMS, Sep. 27, 2007, vol. 6(3), 2 pages.
Wu, et al., "A Study of Process Window Capabilities for Two-dimensional Structures under Double Exposure Condition", 2007, SPIE Proceeding Series, vol. 6520; Feb. 25, 2007.
Xiong, et al., "The Constrained Via Minimization Problem for PCB and VLSI Design", 1988 ACM Press/IEEE, pp. 573-578, Jun. 12, 1998.
Yamamaoto, et al., "New Double Exposure Technique without Alternating Phase Shift Mask", SPIE Proceeding Series, vol. 6520; Feb. 25, 2007.
Yamazoe, et al., "Resolution Enhancement by Aerial Image Approximation with 2D-TCC," 2007 Proc. of SPIE vol. 6730, 12 pages, Sep. 17, 2007.
Yang, et al., "Interconnection Driven VLSI Module Placement Based on Quadratic Programming and Considering Congestion Using LFF Principles", 2004 IEEE, pp. 1243-1247, Jun. 27, 2004.
Yao, et al., "Multilevel Routing With Redundant Via Insertion", Oct. 23, 2006, IEEE, pp. 1148-1152.
Yu, et al., "True Process Variation Aware Optical Proximity Correction with Variational Lithography Modeling and Model Calibration," J. Micro/Nanolith. MEMS MOEMS, Sep. 11, 2007, vol. 6(3), 16 pages.
Zheng, et al."Modeling and Analysis of Regular Symmetrically Structured Power/Ground Distribution Networks", DAC, Jun. 10, 2002, ACM Press, pp. 395-398.
Zhu, et al., "A Stochastic Integral Equation Method for Modeling the Rough Surface Effect on Interconnect Capacitance", 2004 IEEE, Nov. 7, 2004.
Zhu, et al., "A Study of Double Exposure Process Design with Balanced Performance Parameters for Line/Space Applications", 2007, SPIE Proceeding Series, vol. 6520; Feb. 25, 2007.
Zuchowski, et al., "A Hybrid ASIC and FPGA Architecture", 2003 IEEE, pp. 187-194, Nov. 10, 2002.
Alam, Syed M. et al., "A Comprehensive Layout Methodology and Layout-Specific Circuit Analyses for Three-Dimensional Integrated Circuits," Mar. 21, 2002.
Alam, Syed M. et al., "Layout-Specific Circuit Evaluation in 3-D Integrated Circuits," May 1, 2003.
Aubusson, Russel, "Wafer-Scale Integration of Semiconductor Memory," Apr. 1, 1979.
Bachtold, "Logic Circuits with Carbon," Nov. 9, 2001.
Baker, R. Jacob, "CMOS: Circuit Design, Layout, and Simulation (2nd Edition)," Nov. 1, 2004.
Baldi et al., "A Scalable Single Poly EEPROM Cell for Embedded Memory Applications," pp. 1-4, Fig. 1, Sep. 1, 1997.
Cao, Ke, "Design for Manufacturing (DFM) in Submicron VLSI Design," Aug. 1, 2007.
Capodieci, Luigi, "From Optical Proximity Correction to Lithography-Driven Physical Design (1996-2006): 10 years of Resolution Enhancement Technology and the roadmap enablers for the next decade," Proc. SPIE 6154, Optical Microlithography XIX, 615401, Mar. 20, 2006.
Chang, Leland et al., "Stable SRAM Cell Design for the 32 nm Node and Beyond," Jun. 16, 2005.
Cheung, Peter, "Layout Design," Apr. 4, 2004.
Chinnery, David, "Closing the Gap Between ASIC & Custom: Tools and Techniques for High-Performance ASIC Design," Jun. 30, 2002.
Chou, Dyiann et al., "Line End Optimization through Optical Proximity Correction (OPC): A Case Study," Feb. 19, 2006.
Clein, Dan, "CMOS IC Layout: Concepts, Methodologies, and Tools," Dec. 22, 1999.
Cowell, "Exploiting Non-Uniform Access Time," Jul. 1, 2003.
Das, Shamik, "Design Automation and Analysis of Three-Dimensional Integrated Circuits," May 1, 2004.
Dehaene, W. et al., "Technology-Aware Design of SRAM Memory Circuits," Mar. 1, 2007.
Deng, Liang et al., "Coupling-aware Dummy Metal Insertion for Lithography," p. 1, col. 2, Jan. 23, 2007.
Devoivre et al., "Validated 90nm CMOS Technology Platform with Low-k Copper Interconnects for Advanced System-on-Chip (SoC)," Jul. 12, 2002.
Enbody, R. J., "Near-Optimal n-Layer Channel Routing," Jun. 29, 1986.
Ferretti, Marcos et al., "High Performance Asynchronous ASIC Back-End Design Flow Using Single-Track Full-Buffer Standard Cells," Apr. 23, 2004.
Garg, Manish et al., "Litho-driven Layouts for Reducing Performance Variability," p. 2, Figs. 2b-2c, May 23, 2005.
Greenway, Robert et al., "32nm 1-D Regular Pitch SRAM Bitcell Design for Interference-Assisted Lithography," Oct. 6, 2008.
Gupta et al., "Modeling Edge Placement Error Distribution in Standard Cell Library," Feb. 23, 2006.
Grad, Johannes et al., "A standard cell library for student projects," Proceedings of the 2003 IEEE International Conference on Microelectronic Systems Education, Jun. 2, 2003.
Hartono, Roy et al., "Active Device Generation for Automatic Analog Layout Retargeting Tool," May 13, 2004.
Hartono, Roy et al., "IPRAIL—Intellectual Property Reuse-based Analog IC Layout Automation," Mar. 17, 2003.
Hastings, Alan, "The Art of Analog Layout (2nd Edition)," Jul. 4, 2005.
Hurat et al., "A Genuine Design Manufacturability Check for Designers," Feb. 19, 2006.
Institute of Microelectronic Systems, "Digital Subsystem Design," Oct. 13, 2006.
Ishida, M. et al., "A Novel 6T-SRAM Cell Technology Designed with Rectangular Patterns Scalable beyond 0.18 pm Generation and Desirable for Ultra High Speed Operation," IEDM 1998, Dec. 6, 1998.
Jakusovszky, "Linear IC Parasitic Element Simulation Methodology," Oct. 1, 1993.
Jangkrajarng, Nuttorn et al., "Template-Based Parasitic-Aware Optimization and Retargeting of Analog and RF Integrated Circuit Layouts," Nov. 5, 2006.
Kahng, Andrew B., "Design Optimizations DAC-2006 DFM Tutorial, part V)," Jul. 24, 2006.
Kang, Sung-Mo et al., "CMOS Digital Integrated Circuits Analysis & Design," Oct. 29, 2002.
Kottoor, Mathew Francis, "Development of a Standard Cell Library based on Deep Sub-Micron SCMOS Design Rules using Open Source Software (MS Thesis)," Aug. 1, 2005.
Kubicki, "Intel 65nm and Beyond (or Below): IDF Day 2 Coverage (available at http://www.anandtech.com/show/1468/4)," Sep. 9, 2004.
Kuhn, Kelin J., "Reducing Variation in Advanced Logic Technologies: Approaches to Process and Design for Manufacturability of Nanoscale CMOS," p. 27, Dec. 12, 2007.

(56) References Cited

OTHER PUBLICATIONS

Kurokawa, Atsushi et al., "Dummy Filling Methods for Reducing Interconnect Capacitance and Number of Fills, Proc. of ISQED," pp. 586-591, Mar. 21, 2005.
Lavin, Mark, "Open Access Requirements from RDR Design Flows," Nov. 11, 2004.
Liebmann, Lars et al., "Layout Methodology Impact of Resolution Enhancement Techniques," pp. 5-6, Apr. 6, 2003.
Liebmann, Lars et al., "TCAD development for lithography resolution enhancement," Sep. 1, 2001.
Lin, Chung-Wei et al., "Recent Research and Emerging Challenges in Physical Design for Manufacturability/Reliability," Jan. 26, 2007.
McCullen, Kevin W., "Layout Techniques for Phase Correct and Gridded Wiring," pp. 13, 17, Fig. 5, Dec. 1, 2006.
MOSIS, "Design Rules MOSIS Scalable CMOS (SCMOS) (Revision 8.00)," Oct. 4, 2004.
MOSIS, "MOSIS Scalable CMOS (SCMOS) Design Rules (Revision 7.2)," Jan. 1, 1995.
Muta et al., "Manufacturability-Aware Design of Standard Cells," pp. 2686-2690, Figs. 3, 12, Dec. 1, 2007.
Na, Kee-Yeol et al., "A Novel Single Polysilicon EEPROM Cell With a Polyfinger Capacitor," Nov. 30, 2007.
Pan et al., "Redundant Via Enhanced Maze Routing for Yield Improvement," DAC 2005, Jan. 18, 2005.
Park, Tae Hong, "Characterization and Modeling of Pattern Dependencies in Copper Interconnects for Integrated Circuits," Ph.D. Thesis, MIT, May 24, 2002.
Patel, Chetan, "An Architectural Exploration of Via Patterned Gate Arrays (CMU Master's Project)," May 1, 2003.
Pease, R. Fabian et al., "Lithography and Other Patterning Techniques for Future Electronics," IEEE 2008, vol. 96, Issue 2, Jan. 16, 2008.
Serrano, Diego Emilio, Pontificia Universidad Javeriana Facultad De Ingenieria, Departamento De Electronica, "Diseño De Multiplicador 4×8 en VLSI, Introduccion al VLSI," 2006 (best available publication date).
Pramanik, "Impact of layout on variability of devices for sub 90nm technologies," 2004 (best available publication date).
Pramanik, Dipankar et al., "Lithography-driven layout of logic cells for 65-nm node (SPIE Proceedings vol. 5042)," Jul. 10, 2003.
Roy et al., "Extending Aggressive Low-K1 Design Rule Requirements for 90 and 65 Nm Nodes Via Simultaneous Optimization of Numerical Aperture, Illumination and Optical Proximity Correction," J.Micro/Nanolith, MEMS MOEMS, 4(2), 023003, Apr. 26, 2005.
Saint, Christopher et al., "IC Layout Basics: A Practical Guide," Chapter 3, Nov. 5, 2001.
Saint, Christopher et al., "IC Mask Design: Essential Layout Techniques," May 24, 2002.
Scheffer, "Physical CAD Changes to Incorporate Design for Lithography and Manufacturability," Feb. 4, 2004.
Smayling, Michael C., "Part 3: Test Structures, Test Chips, In-Line Metrology & Inspection," Jul. 24, 2006.
Spence, Chris, "Full-Chip Lithography Simulation and Design Analysis: How OPC is changing IC Design, Emerging Lithographic Technologies IX," May 6, 2005.

Subramaniam, Anupama R., "Design Rule Optimization of Regular layout for Leakage Reduction in Nanoscale Design," pp. 474-478, Mar. 24, 2008.
Tang, C. W. et al., "A compact large signal model of LDMOS," Solid-State Electronics 46(2002) 2111-2115, May 17, 2002.
Taylor, Brian et al., "Exact Combinatorial Optimization Methods for Physical Design of Regular Logic Bricks," Jun. 8, 2007.
Tian, Ruiqi et al., "Dummy Feature Placement for Chemical-Mechanical Uniformity in a Shallow Trench Isolation Process," IEEE Trans. on Computer-Aided Design of Integrated Circuits and Systems, vol. 21, No. 1, pp. 63-71, Jan. 1, 2002.
Tian, Ruiqi et al., "Proximity Dummy Feature Placement and Selective Via Sizing for Process Uniformity in a Trench-First-Via-Last Dual-Inlaid Metal Process," Proc. of IITC, pp. 48-50, Jun. 6, 2001.
Torres, J. A. et al., "RET Compliant Cell Generation for sub-130nm Processes," SPIE vol. 4692, Mar. 6, 2002.
Uyemura, John P., "Introduction to VLSI Circuits and Systems," Chapters 2, 3, 5, and Part 3, Jul. 30, 2001.
Uyemura, John, "Chip Design for Submicron VLSI: CMOS Layout and Simulation," Chapters 2-5, 7-9, Feb. 8, 2005.
Verhaegen et al., "Litho Enhancements for 45nm-nod MuGFETs," Aug. 1, 2005.
Wong, Ban P., "Bridging the Gap between Dreams and Nano-Scale Reality (DAC-2006 DFM Tutorial)," Jul. 28, 2006.
Wang, Dunwei et al., "Complementary Symmetry Silicon Nanowire Logic: Power-Efficient Inverters with Gain," Aug. 17, 2006.
Wang, Jun et al., "Effects of grid-placed contacts on circuit performance," pp. 135-139, Figs. 2, 4-8, Feb. 28, 2003.
Wang, Jun et al., "Standard cell design with regularly placed contacts and gates (SPIE vol. 5379)," Feb. 22, 2004.
Wang, Jun et al., "Standard cell design with resolution-enhancement-technique-driven regularly placed contacts and gates," J. Micro/Nanolith, MEMS MOEMS, 4(1), 013001, Mar. 16, 2005.
Watson, Bruce, "Challenges and Automata Applications in Chip-Design Software," pp. 38-40, Jul. 16, 2007.
Weste, Neil et al., "CMOS VLSI Design: A Circuits and Systems Perspective, 3rd Edition," May 21, 2004.
Wingerden, Johannes van, "Experimental verification of improved printability for litho-driven designs," Mar. 14, 2005.
Wong, Alfred K., "Microlithography: Trends, Challenges, Solutions and Their Impact on Design," Micro IEEE vol. 23, Issue 2, Apr. 29, 2003.
Xu, Gang, "Redundant-Via Enhanced Maze Routing for Yield Improvement," Proceedings of ASP-DAC 2005, Jan. 18, 2005.
Yang, Jie, "Manufacturability Aware Design," pp. 93, 102, Fig. 5.2, Jan. 16, 2008.
Yongshun, Wang et al., "Static Induction Devices with Planar Type Buried Gate," Chinese Journal of Semiconductors, vol. 25, No. 2, Feb. 1, 2004.
Zobrist, George (editor), "Progress in Computer Aided VLSI Design: Implementations (Ch. 5)," Ablex Publishing Corporation, Feb. 1, 1990.
Petley, Graham, "VLSI and ASIC Technology Standard Cell Library Design," from website www.vlsitechnology.org, Jan. 11, 2005.
Liebmann, Lars, et al., "Layout Optimization at the Pinnacle of Optical Lithography," Design and Process Integration for Microelectronic Manufacturing II, Proceedings of SPIE vol. 5042, Jul. 8, 2003.

* cited by examiner

| A (Node-101) | 0 |
|---|---|
| B (Node-102) | 0 |
| Q (Node-105) | 0 |
| Node-103 | 1 |
| Node-104 | 1 |

Fig. 1B
(Prior Art)

| A (Node-101) | 0 |
|---|---|
| B (Node-102) | 1 |
| Q (Node-105) | 1 |
| Node-103 | 1 |
| Node-104 | 0 |

Fig. 1C
(Prior Art)

| A (Node-101) | 1 |
|---|---|
| B (Node-102) | 0 |
| Q (Node-105) | 1 |
| Node-103 | 0 |
| Node-104 | 1 |

Fig. 1D
(Prior Art)

| A (Node-101) | 1 |
|---|---|
| B (Node-102) | 1 |
| Q (Node-105) | 0 |
| Node-103 | 0 |
| Node-104 | 0 |

Fig. 1E
(Prior Art)

| | |
|---|---|
| A (Node-201) | 0 |
| B (Node-202) | 0 |
| Q (Node-207) | 1 |
| Node-203 | 1 |
| Node-204 | 1 |
| Node-205 | 0 |
| Node-206 | 0 |

Fig. 2B

| | |
|---|---|
| A (Node-201) | 0 |
| B (Node-202) | 1 |
| Q (Node-207) | 0 |
| Node-203 | 1 |
| Node-204 | 0 |
| Node-205 | 1 |
| Node-206 | 1 |

Fig. 2C

| | |
|---|---|
| A (Node-201) | 1 |
| B (Node-202) | 0 |
| Q (Node-207) | 0 |
| Node-203 | 0 |
| Node-204 | 1 |
| Node-205 | 1 |
| Node-206 | 0 |

Fig. 2D

| | |
|---|---|
| A (Node-201) | 1 |
| B (Node-202) | 1 |
| Q (Node-207) | 1 |
| Node-203 | 0 |
| Node-204 | 0 |
| Node-205 | 0 |
| Node-206 | 0 |

Fig. 2E

| | |
|---|---|
| A (Node-301) | 0 |
| B (Node-302) | 0 |
| Q (Node-307) | 0 |
| Node-303 | 1 |
| Node-304 | 1 |
| Node-305 | 1 |
| Node-306 | 0 |

Fig. 3B

| | |
|---|---|
| A (Node-301) | 0 |
| B (Node-302) | 1 |
| Q (Node-307) | 1 |
| Node-303 | 1 |
| Node-304 | 0 |
| Node-305 | 0 |
| Node-306 | 1 |

Fig. 3C

| | |
|---|---|
| A (Node-301) | 1 |
| B (Node-302) | 0 |
| Q (Node-307) | 1 |
| Node-303 | 0 |
| Node-304 | 1 |
| Node-305 | 0 |
| Node-306 | 0 |

Fig. 3D

| | |
|---|---|
| A (Node-301) | 1 |
| B (Node-302) | 1 |
| Q (Node-307) | 0 |
| Node-303 | 0 |
| Node-304 | 0 |
| Node-305 | 1 |
| Node-306 | 1 |

Fig. 3E

CIRCUITRY AND LAYOUTS FOR XOR AND XNOR LOGIC

CLAIM OF PRIORITY

This application is a divisional application under 35 U.S.C. 121 of prior U.S. patent application Ser. No. 12/435,672, filed on May 5, 2009, which:

1) claims priority under 35 U.S.C. 119(e) to U.S. Provisional Patent Application No. 61/174,408, filed Apr. 30, 2009, and
2) is a continuation-in-part application under 35 U.S.C. 120 of prior U.S. patent application Ser. No. 12/212,562, filed Sep. 17, 2008, issued as U.S. Pat. No. 7,842,975, on Nov. 30, 2010, which is a continuation application under 35 U.S.C. 120 of prior U.S. application Ser. No. 11/683,402, filed Mar. 7, 2007, issued as U.S. Pat. No. 7,446,352, on Nov. 4, 2008, which claims priority under 35 U.S.C. 119(e) to U.S. Provisional Patent Application No. 60/781,288, filed Mar. 9, 2006.

The disclosure of each above-identified patent application is incorporated by reference herein in its entirety.

BACKGROUND

A push for higher performance and smaller die size drives the semiconductor industry to reduce circuit chip area by approximately 50% every two years. The chip area reduction provides an economic benefit for migrating to newer technologies. The 50% chip area reduction is achieved by reducing the feature sizes between 25% and 30%. The reduction in feature size is enabled by improvements in manufacturing equipment and materials. For example, improvement in the lithographic process has enabled smaller feature sizes to be achieved, while improvement in chemical mechanical polishing (CMP) has in-part enabled a higher number of interconnect layers.

In the evolution of lithography, as the minimum feature size approached the wavelength of the light source used to expose the feature shapes, unintended interactions occurred between neighboring features. Today minimum feature sizes are being reduced below 45 nm (nanometers), while the wavelength of the light source used in the photolithography process remains at 193 nm. The difference between the minimum feature size and the wavelength of light used in the photolithography process is defined as the lithographic gap. As the lithographic gap grows, the resolution capability of the lithographic process decreases.

An interference pattern occurs as each shape on the mask interacts with the light. The interference patterns from neighboring shapes can create constructive or destructive interference. In the case of constructive interference, unwanted shapes may be inadvertently created. In the case of destructive interference, desired shapes may be inadvertently removed. In either case, a particular shape is printed in a different manner than intended, possibly causing a device failure. Correction methodologies, such as optical proximity correction (OPC), attempt to predict the impact from neighboring shapes and modify the mask such that the printed shape is fabricated as desired. The quality of the light interaction prediction is declining as process geometries shrink and as the light interactions become more complex.

In view of the foregoing, solutions are sought for improvements in circuit design and layout that can improve management of lithographic gap issues as technology continues to progress toward smaller semiconductor device features sizes.

SUMMARY

In one embodiment, an exclusive-or (XOR) logic circuit is disclosed. The XOR logic circuit includes a first input node, a second input node, and an output node. A pass gate is connected to be controlled by a logic state present at the second input node. The pass gate is connected to pass through a version of a logic state present at the first input node to the output node when controlled to transmit by the logic state present at the second input node. A transmission gate is connected to be controlled by the logic state present at the first input node. The transmission gate is connected to pass through a version of the logic state present at the second input node to the output node when controlled to transmit by the logic state present at the first input node. Pullup logic is connected to be controlled by both the logic state present at the first input node and the logic state present at the second input node. The pullup logic is connected to drive a state present at the output node low when both the logic state present at the first input node and the logic state present at the second input node are high.

In one embodiment, an exclusive-or (XOR) logic circuit layout is disclosed. The XOR logic circuit layout includes six PMOS transistors and five NMOS transistors. The five NMOS transistors are respectively paired with five of the six PMOS transistors, such that each pair of NMOS and PMOS transistors is defined to share a contiguous gate electrode structure placed along a respective one of five gate electrode tracks. A sixth of the six PMOS transistors is defined by a gate electrode structure placed along a sixth gate electrode track, such that the sixth PMOS transistor does not share the sixth gate electrode track with another transistor within the exclusive-or logic circuit layout. The six gate electrode tracks are oriented parallel to each other.

In one embodiment, an exclusive-nor (XNOR) logic circuit is disclosed. The XNOR logic circuit includes a first input node, a second input node, and an output node. A pass gate is connected to be controlled by a logic state present at the second input node. The pass gate is connected to pass through a version of a logic state present at the first input node to the output node when controlled to transmit by the logic state present at the second input node. A transmission gate is connected to be controlled by the logic state present at the first input node. The transmission gate is connected to pass through a version of the logic state present at the second input node to the output node when controlled to transmit by the logic state present at the first input node. Pulldown logic is connected to be controlled by both the logic state present at the first input node and the logic state present at the second input node. The pulldown logic is connected to drive a state present at the output node high when both the logic state present at the first input node and the logic state present at the second input node are low.

In one embodiment, an exclusive-nor (XNOR) logic circuit layout is disclosed. The XNOR logic circuit layout includes five PMOS transistors and six NMOS transistors. The five PMOS transistors are respectively paired with five of the six NMOS transistors, such that each pair of PMOS and NMOS transistors is defined to share a contiguous gate electrode structure placed along a respective one of five gate electrode tracks. A sixth of the six NMOS transistors is defined by a gate electrode structure placed along a sixth gate electrode track, such that the sixth NMOS transistor does not share the sixth gate electrode track with another transistor within the exclusive-nor logic circuit layout. The six gate electrode tracks are oriented parallel to each other.

Other aspects and advantages of the invention will become more apparent from the following detailed description, taken in conjunction with the accompanying drawings, illustrating by way of example the present invention.

BRIEF DESCRIPTION OF THE DRAWINGS

FIGS. 1B-1E show state tables for the conventional XOR logic gate circuit of FIG. 1A;

FIGS. 2B-2E show state tables for the XNOR logic gate circuit of FIG. 2A, in accordance with one embodiment of the present invention;

FIGS. 3B-3E show state tables for the XOR logic gate circuit of FIG. 3A, in accordance with one embodiment of the present invention;

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Conventional XOR Circuit

Figure 1A:
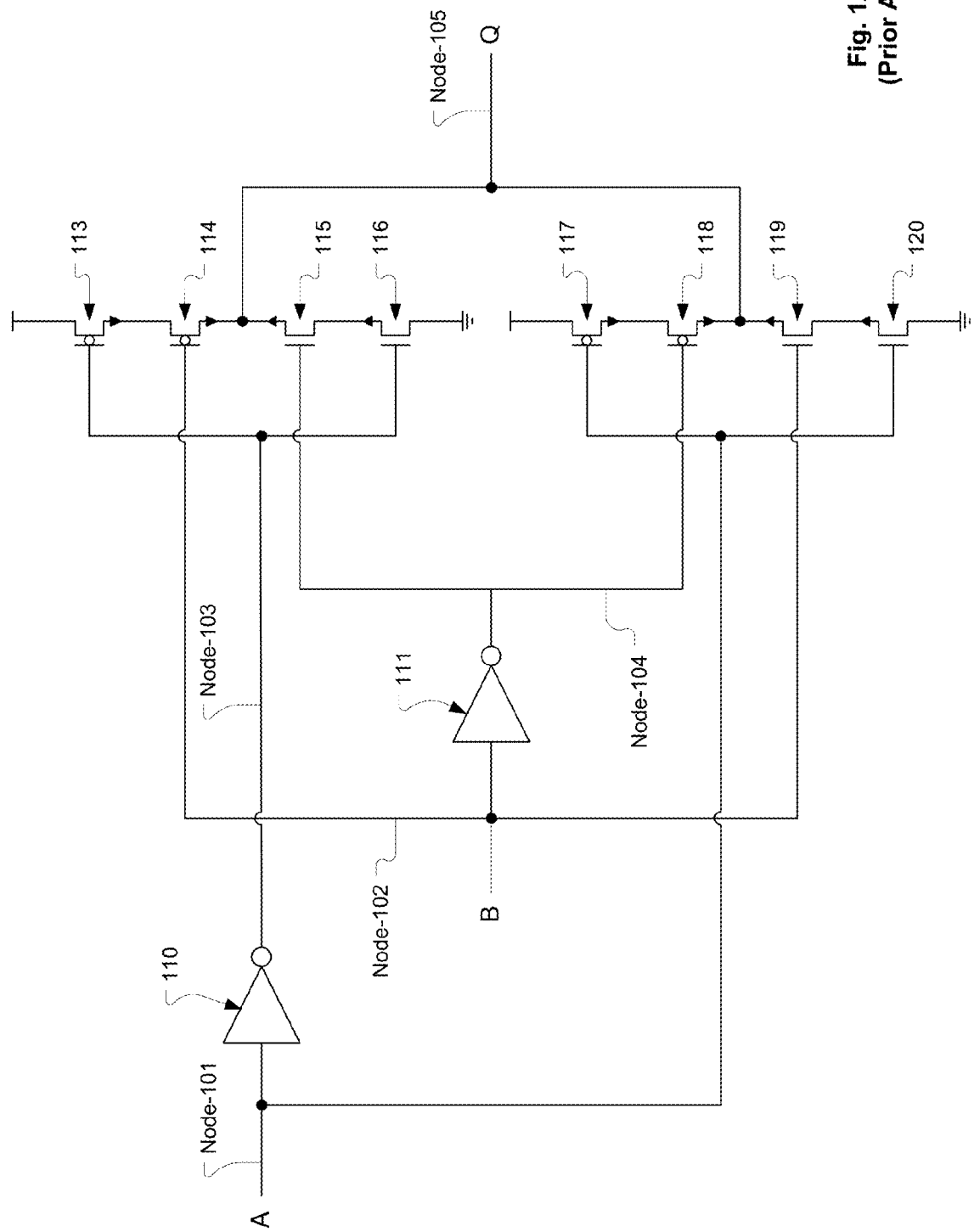
FIG. 1A shows a conventional XOR logic gate circuit.

FIG. 1A shows a conventional XOR logic gate circuit ("XOR 100" hereafter). The XOR 100 includes two inputs A and B, and one output Q. The input A is provided at a node 101. The input B is provided at a node 102. The output Q is provided at a node 105. FIGS. 1B-1E show state tables for the XOR 100. As shown in FIGS. 1B-1E, the XOR 100 provides an appropriate state of output Q for the various state combinations of inputs A and B.

As shown in FIG. 1A, the node 101 which receives the input A is connected to a gate of a PMOS transistor 117 and to a gate of an NMOS transistor 120. The node 101 is also connected to an input of an inverter 110. An output of the inverter 110 is connected to a node 103. The node 103 is connected to a gate of a PMOS transistor 113 and to a gate of an NMOS transistor 116.

The node 102 is connected to a gate of a PMOS transistor 114 and to a gate of an NMOS transistor 119. The node 102 is also connected to an input of an inverter 111. An output of the inverter 111 is connected to a node 104. The node 104 is connected to a gate of an NMOS transistor 115 and to a gate of a PMOS transistor 118.

The PMOS transistors 113 and 114 are connected in a serial manner between a power supply (VDD) and the node 105, which provides the XOR 100 output Q. The NMOS transistors 115 and 116 are connected in a serial manner between the node 105 and a reference ground potential (GND). The PMOS transistors 117 and 118 are connected in a serial manner between the power supply (VDD) and the node 105. The NMOS transistors 119 and 120 are connected in a serial manner between the node 105 and the reference ground potential (GND).

Based on the foregoing, the conventional XOR 100 includes two sets of pullup logic, where the first set is defined by PMOS transistors 113 and 114, and the second set is defined by PMOS transistors 117 an 118. The XOR 100 also includes two sets of pulldown logic, where the first set is defined by NMOS transistors 115 and 116, and the second set is defined by NMOS transistors 119 and 120. Each set of pullup and pulldown logic is controlled by both a version of the input A and a version of the input B. Therefore, based on the inputs A and B, the circuitry of the conventional XOR 100 is defined to drive the output Q either high or low by use of either set of pullup logic or either set of pulldown logic, respectively.

Additionally, it should be understood that each of inverters 110 and 111 includes one PMOS transistor and one NMOS transistor. FIG. 1G shows an example inverter configuration, in accordance with the prior art. The inverter receives an input signal A and produces an output signal Q. The inverter includes a PMOS transistor 192 having a gate connected to be controlled by the input signal A, a first terminal connected to a power supply (VDD), and a second terminal connected to provide the output signal Q. The inverter also includes an NMOS transistor 193 having a gate connected to be controlled by the input signal A, a first terminal connected to provide the output signal Q, and a second terminal connected to a reference ground potential (GND). When the input A of the inverter is high the output is low, vice-versa. Based on each inverter including one PMOS transistor and one NMOS transistor, it should be understood that the conventional XOR 100 includes a total of 6 PMOS transistors and 6 NMOS transistors.

Figure 1F:
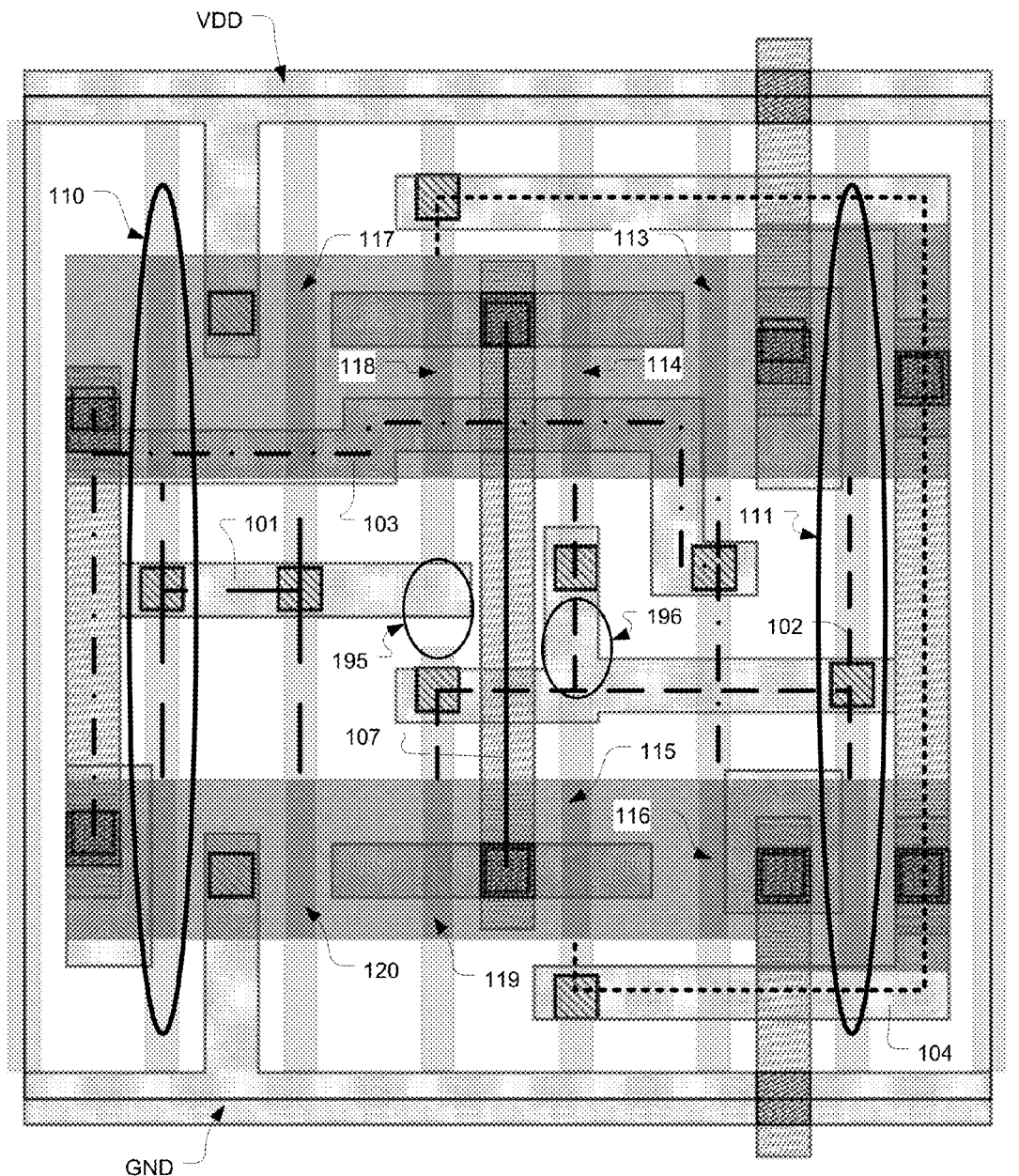
FIG. 1F shows a layout of the conventional XOR, in accordance with one embodiment of the present invention.
Figure 1G:
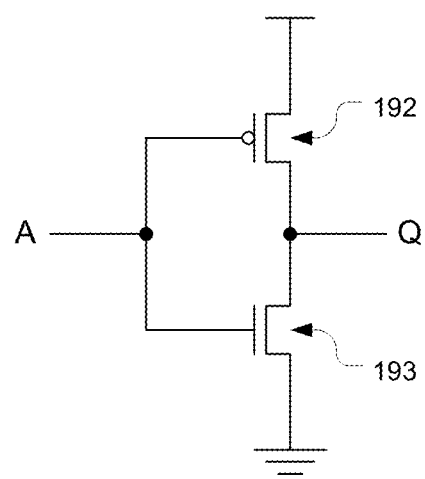
FIG. 1G shows an example inverter configuration, in accordance with the prior art.

FIG. 1F shows a layout of the XOR 100, in accordance with one embodiment of the present invention. The layout of the XOR 100 is defined in accordance with a restricted gate level layout architecture, as described herein. The various PMOS and NMOS transistors as previously described with regard to FIG. 1A are labeled accordingly in the layout of FIG. 1F. The various nodes as previously described with regard to FIG. 1A are also labeled accordingly in the layout of FIG. 1F. The gate electrodes of the PMOS transistor 118 and NMOS transistor 119 are defined in a co-linear manner such that they are separated within gate the level by an end-to-end spacing 195. Also, the gate electrodes of the PMOS transistor 114 and NMOS transistor 115 are defined in a co-linear manner such that they are separated within gate the level by an end-to-end spacing 196.

It should be understood that in order to layout the conventional XOR 100 within six gate electrode tracks using the restricted gate level architecture, it is necessary to have at least two gate electrode end-to-end spacings, e.g., 195 and 196, within the gate level of the XOR 100. Such end-to-end gate electrode spacings are defined in accordance with applicable design rules which require a minimum end-to-end spacing size. Therefore, it should be appreciated that the presence of end-to-end gate electrode spacings can require the P-type and N-type diffusion regions to be separated more than what would be required in the absence of end-to-end gate electrode spacings, thereby requiring a larger overall cell height.

XOR Circuit and Layout Embodiments

Figure 3A:
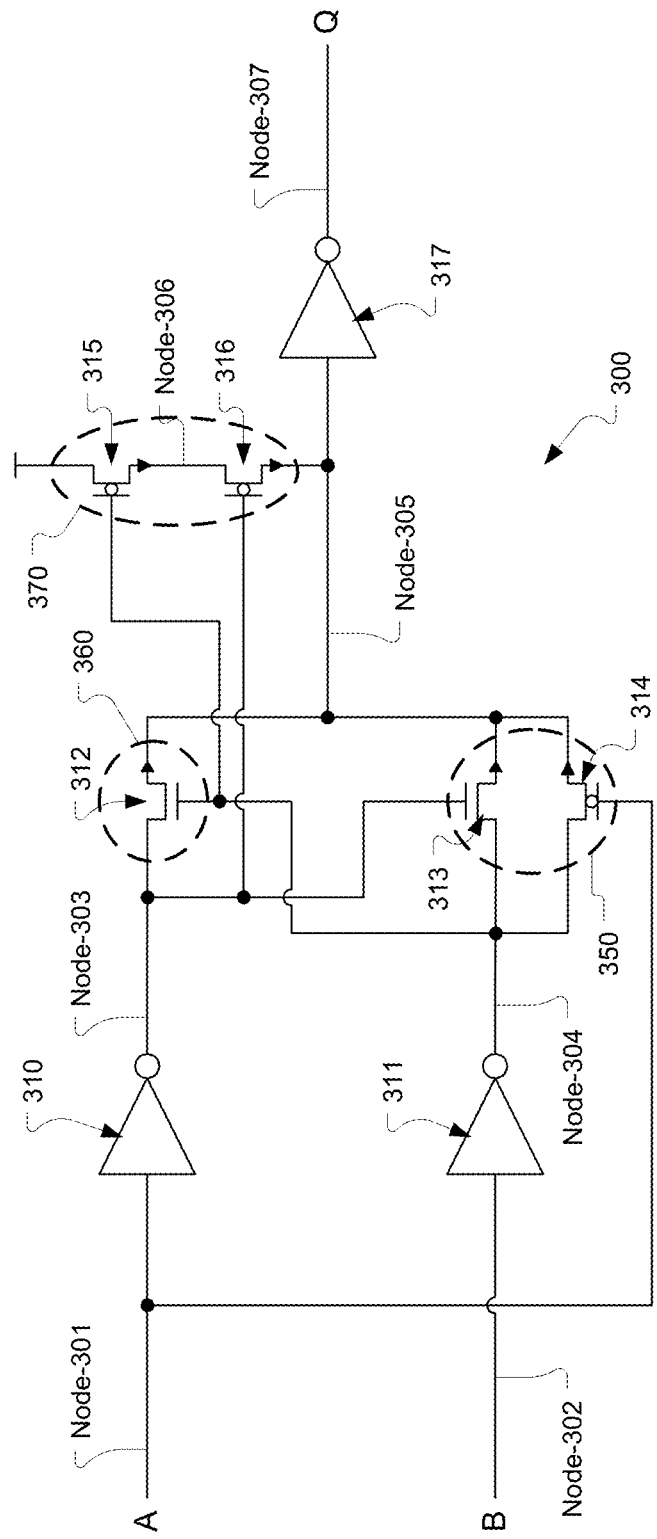
FIG. 3A shows an XOR logic gate circuit, in accordance with one embodiment of the present invention.

FIG. 3A shows an XOR logic gate circuit 300 ("XOR 300" hereafter), in accordance with one embodiment of the present invention. The XOR 300 includes two inputs A and B, and one output Q. The input A is provided at a node 301. The input B is provided at a node 302. The output Q is provided at a node 307. FIGS. 3B-3E show state tables for the XOR 300, in accordance with one embodiment of the present invention. As shown in FIGS. 3B-3E, the XOR 300 provides an appropriate state of output Q for the various state combinations of inputs A and B.

As shown in FIG. 3A, the node 301 which receives the input A is connected to both an input of an inverter 310 and to a gate of a PMOS transistor 314. The node 302 which receives the input B is connected to an input of an inverter 311. The output of the inverter 310 is connected to a node 303. The node 303 is connected to: 1) a first terminal of an NMOS transistor 312, 2) a gate of a PMOS transistor 316, and 3) a gate of an NMOS transistor 313. The output of the inverter 311 is connected to a node 304. The node 304 is connected to: 1) a gate of the NMOS transistor 312, 2) a gate of a PMOS transistor 315, 3) a first terminal of the NMOS transistor 313, and 4) a first terminal of the PMOS transistor 314.

A node 305 is connected to each of: 1) a second terminal of the NMOS transistor 312, 2) a second terminal of the NMOS transistor 313, 3) a second terminal of the PMOS transistor 314, and 4) a second terminal of the PMOS transistor 316. A first terminal of the PMOS transistor 315 is connected to a power supply (VDD). A second terminal of the PMOS transistor 315 is connected to a node 306, which is connected to an first terminal of the PMOS transistor 316. The node 305 is connected to an input of an inverter 317. An output of the inverter 317 is connected to a node 307, which provides the output Q of the XOR 300.

The state tables of FIGS. 3B-3E show the different states of the various nodes (Node-301 through Node-307) of the XOR 300 for application of different state combinations at the inputs A and B. Each of inverters 310, 311, and 317 includes one PMOS transistor and one NMOS transistor. Therefore, in contrast to the conventional XOR 100 that includes a total of six PMOS transistor and six NMOS transistors, the XOR 300 includes a total of six PMOS transistors and five NMOS transistors, thereby saving one NMOS transistor.

The 2-input XOR 300 is defined to process four unique combinations of inputs A and B, as depicted in FIGS. 3B-3E. Specifically, the NMOS transistor 313 and PMOS transistor 314 together define a transmission gate 350 which is controlled by the input A. When the state of input A is low, i.e., a logical 0, the transmission gate 350 contributes to control of the state of output Q, such that the state of output Q matches the state of input B. The NMOS transistor 312 defines a pass gate 360 which is controlled by the input B. When the state of input B is low, i.e., logical 0, the pass gate 360 contributes to control of the state of output Q, such that the state of output Q matches the state of input A.

The PMOS transistors 315 and 316 together define pullup logic 370 which is controlled by both of the inputs A and B. When both the state of input A and the state of input B are high, i.e., logical 1, both the transmission gate 350 and pass gate 360 are disabled, and the pullup logic 370 controls the state of output Q, such that the state of output Q is low, i.e., a logical 0. When either state of inputs A and B is low, i.e., logical 0, the pullup logic 370 is disabled.

The XOR 300 is defined to either:
pass through a version of the state of input A to the output Q by way of pass gate 360 controlled by input B,
pass through a version of the state of input B to the output Q by way of a transmission gate 350 controlled by input A, or
drive a state of the output Q low by way of pullup logic 370 under the control of both inputs A and B.

In accordance with the foregoing, the XOR logic circuit 300 includes the first input A node 301, the second input B node 302, and the output Q node 307. The pass gate 360 is connected to be controlled by a logic state present at the second input node 302. The pass gate 360 is connected to pass through a version of a logic state present at the first input node 301 to the output node 307 when controlled to transmit by the logic state present at the second input node 302. The transmission gate 350 is connected to be controlled by the logic state present at the first input node 301. The transmission gate 350 is connected to pass through a version of the logic state present at the second input node 302 to the output node 307 when controlled to transmit by the logic state present at the first input node 301. Pullup logic 370 is connected to be controlled by both the logic state present at the first input node 301 and the logic state present at the second input node 302. The pullup logic 370 is connected to drive a state present at the output node 307 low when both the logic state present at the first input node 301 and the logic state present at the second input node 302 are high.

Figure 3F:
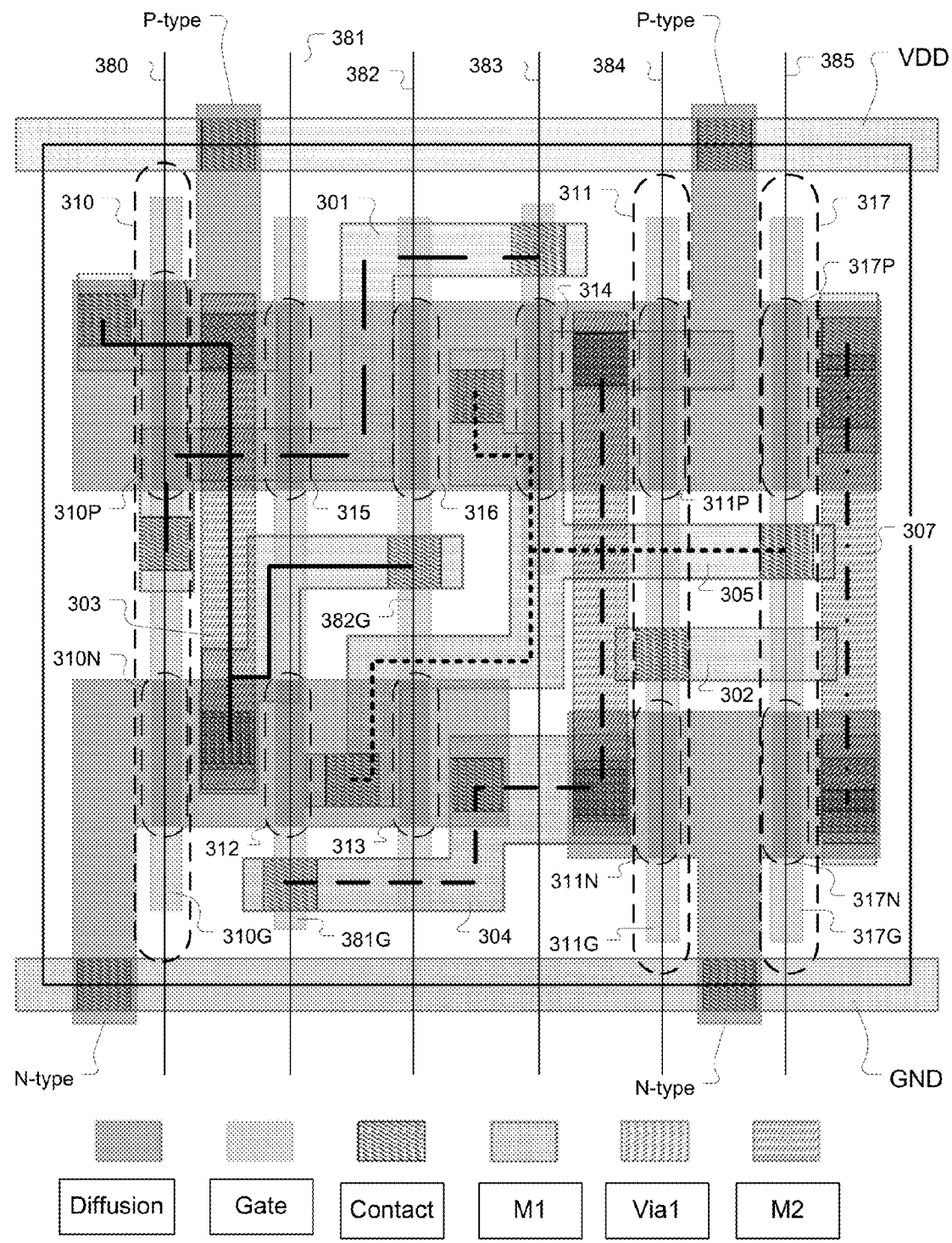
FIG. 3F shows a layout of the XOR logic gate circuit of FIG. 3A, in accordance with one embodiment of the present invention.

FIG. 3F shows a layout of the XOR 300, in accordance with one embodiment of the present invention. In one embodiment, the layout of the XOR 300 is defined based on a restricted gate level layout architecture, as described herein. Inverter 310 is defined by a PMOS transistor 310P and an NMOS transistor 310N which share a contiguous gate electrode structure 310G defined along a single gate electrode track 380. Inverter 311 is defined by a PMOS transistor 311P and an NMOS transistor 311N which share a contiguous gate electrode structure 311G defined along a single gate electrode track 384. Inverter 317 is defined by a PMOS transistor 317P and an NMOS transistor 317N which share a contiguous gate electrode structure 317G defined along a single gate electrode track 385.

The PMOS transistor 315 of the pullup logic 370 and the NMOS transistor 312 of the pass gate 360 share a contiguous gate electrode structure 381G defined along a single gate electrode track 381. The PMOS transistor 316 of the pullup logic 370 and the NMOS transistor 313 of the transmission gate 350 share a contiguous gate electrode structure 382G defined along a single gate electrode track 382. The PMOS transistor 314 of the transmission gate 350 is defined along a single gate electrode track 383. The nodes 301-307 are defined in the XOR 300 layout by various combinations of contacts, interconnect structures (M1, M2), and vias (Via1), so as make the connections between the various transistors as shown in FIG. 3A.

It should be appreciated that the layout of the XOR 300, when defined in accordance with the restricted gate electrode architecture, is defined using six adjacent gate electrode tracks (380-385). In one embodiment, the six adjacent gate electrode tracks (380-385) are equally spaced apart. However, in another embodiment, different perpendicular spacings can be used to separate the six adjacent gate electrode tracks (380-385). Also, it should be appreciated that the layout of the XOR 300, when defined in accordance with the restricted gate electrode architecture, does not require placement of opposing gate electrode line ends. In other words, there are no gate electrode structures placed end-to-end along any given gate electrode track within the XOR 300 layout. Therefore, lithographic difficulties associated with manufacturing end-to-end spacings between gate electrode features is avoided.

Also, because there are no end-to-end gate electrode spacings positioned along a given gate electrode track between the P-type diffusion region and the N-type diffusion region, the perpendicular layout space between the P-type and N-type diffusion regions is not forced to comply with a minimum size requirement, as would be dictated by design rules associated with placement/manufacture of end-to-end gate electrode spacings. Thus, if desired in certain embodiments, the overall cell height of the XOR 300 layout, i.e., the perpendicular distance between VDD and GND, may be reduced by spacing the P-type and N-type diffusion regions closer together.

Additionally, although the exemplary embodiment of FIGS. 3A and 3F show the pullup logic 370 defined such that the gate of the PMOS transistor 315 is connected to the output of the second input inverter 311, and such that the gate of the PMOS transistor 316 is connected to the output of the first input inverter 310, it should be understood that the stack of PMOS transistors 315 and 316 can be reversed. Specifically, in one embodiment, the pullup logic 370 is defined such that the gate of the PMOS transistor 315 is connected to the output of the first input inverter 310, and such that the gate of the PMOS transistor 316 is connected to the output of the second input inverter 311.

XNOR Circuit and Layout Embodiments

Figure 2A:
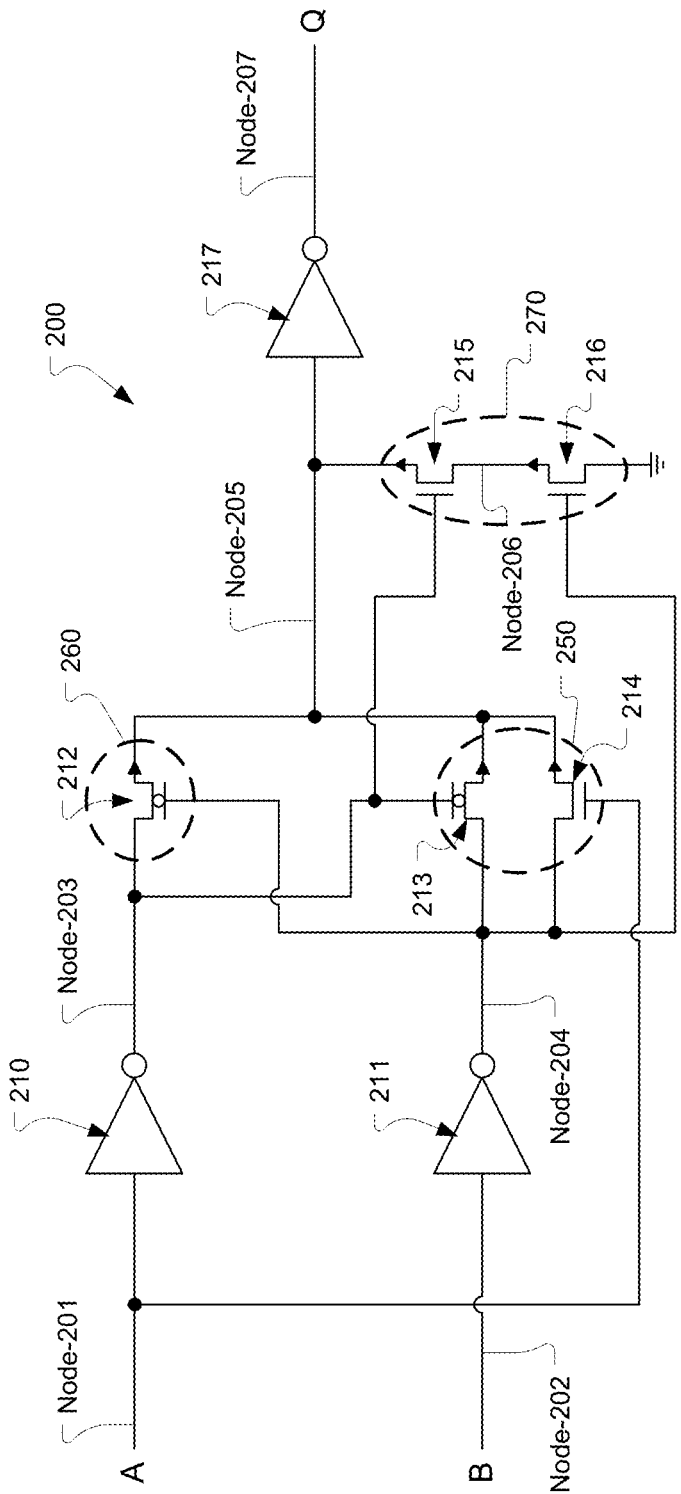
FIG. 2A shows an XNOR logic gate circuit, in accordance with one embodiment of the present invention.

FIG. 2A shows an XNOR logic gate circuit 200 ("XNOR 200" hereafter), in accordance with one embodiment of the present invention. The XNOR 200 includes two inputs A and B, and one output Q. The input A is provided at a node 201. The input B is provided at a node 202. The output Q is provided at a node 207. FIGS. 2B-2E show state tables for the XNOR 200, in accordance with one embodiment of the present invention. As shown in FIGS. 2B-2E, the XNOR 200 provides an appropriate state of output Q for the various state combinations of inputs A and B.

As shown in FIG. 2A, the node 201 which receives the input A is connected to both an input of an inverter 210 and to a gate of an NMOS transistor 214. The node 202 which receives the input B is connected to an input of an inverter 211. The output of the inverter 210 is connected to a node 203. The node 203 is connected to: 1) a first terminal of an PMOS transistor 212, 2) a gate of a PMOS transistor 213, and 3) a gate of an NMOS transistor 215. The output of the inverter 211 is connected to a node 204. The node 204 is connected to: 1) a gate of the PMOS transistor 212, 2) a gate of an NMOS transistor 216, 3) a first terminal of the PMOS transistor 213, and 4) a first terminal of the NMOS transistor 214.

A node 205 is connected to each of: 1) a second terminal of the PMOS transistor 212, 2) a second terminal of the PMOS transistor 213, 3) a second terminal of the NMOS transistor 214, and 4) a second terminal of the NMOS transistor 215. A first terminal of the NMOS transistor 216 is connected to a reference ground potential (GND). A second terminal of the NMOS transistor 216 is connected to a node 206, which is connected to a first terminal of the NMOS transistor 215. The node 205 is connected to an input of an inverter 217. An output of the inverter 217 is connected to a node 207, which provides the output Q of the XNOR 200. The state tables of FIGS. 2B-2E show the different states of the various nodes (Node-201 through Node-207) of the XNOR 200 for application of different state combinations at the inputs A and B. Each of inverters 210, 211, and 217 includes one PMOS transistor and one NMOS transistor. Therefore, the XNOR 200 includes a total of five PMOS transistors and six NMOS transistors.

The 2-input XNOR 200 is defined to process four unique combinations of inputs A and B, as depicted in FIGS. 2B-2E. Specifically, the PMOS transistor 213 and NMOS transistor 214 together define a transmission gate 250 which is controlled by the input A. When the state of input A is high, i.e., a logical 1, the transmission gate 250 contributes to control of the state of output Q, such that the state of output Q matches the state of input B. The PMOS transistor 212 defines a pass gate 260 which is controlled by the input B. When the state of input B is high, i.e., logical 1, the pass gate 260 contributes to control of the state of output Q, such that the state of output Q matches the state of input A.

The NMOS transistors 215 and 216 together define pulldown logic 270 which is controlled by both of the inputs A and B. When both the state of input A and the state of input B are low, i.e., logical 0, both the transmission gate 250 and pass gate 260 are disabled, and the pulldown logic 270 controls the state of output Q, such that the state of output Q is high, i.e., a logical 1. When either state of inputs A and B is high, i.e., logical 1, the pulldown logic 270 is disabled.

Based on the foregoing, the XNOR 200 is defined to either:
 pass through a version of the state of input A to the output Q by way of pass gate 260 controlled by input B,
 pass through a version of the state of input B to the output Q by way of a transmission gate 250 controlled by input A, or
 drive a state of the output Q high by way of pulldown logic 270 under the control of both inputs A and B.

In accordance with the foregoing, the XNOR logic circuit 200 includes the first input A node 201, the second input B node 202, and the output Q node 207. The pass gate 260 is connected to be controlled by a logic state present at the second input node 202. The pass gate 260 is connected to pass through a version of a logic state present at the first input node 201 to the output node 207 when controlled to transmit by the logic state present at the second input node 202. The transmission gate 250 is connected to be controlled by the logic state present at the first input node 201. The transmission gate 250 is connected to pass through a version of the logic state present at the second input node 202 to the output node 207 when controlled to transmit by the logic state present at the first input node 201. Pulldown logic 270 is connected to be controlled by both the logic state present at the first input node 201 and the logic state present at the second input node 202. The pulldown logic 270 is connected to drive a state present at the output node 207 high when both the logic state present at the first input node 201 and the logic state present at the second input node 202 are low.

Figure 2F:
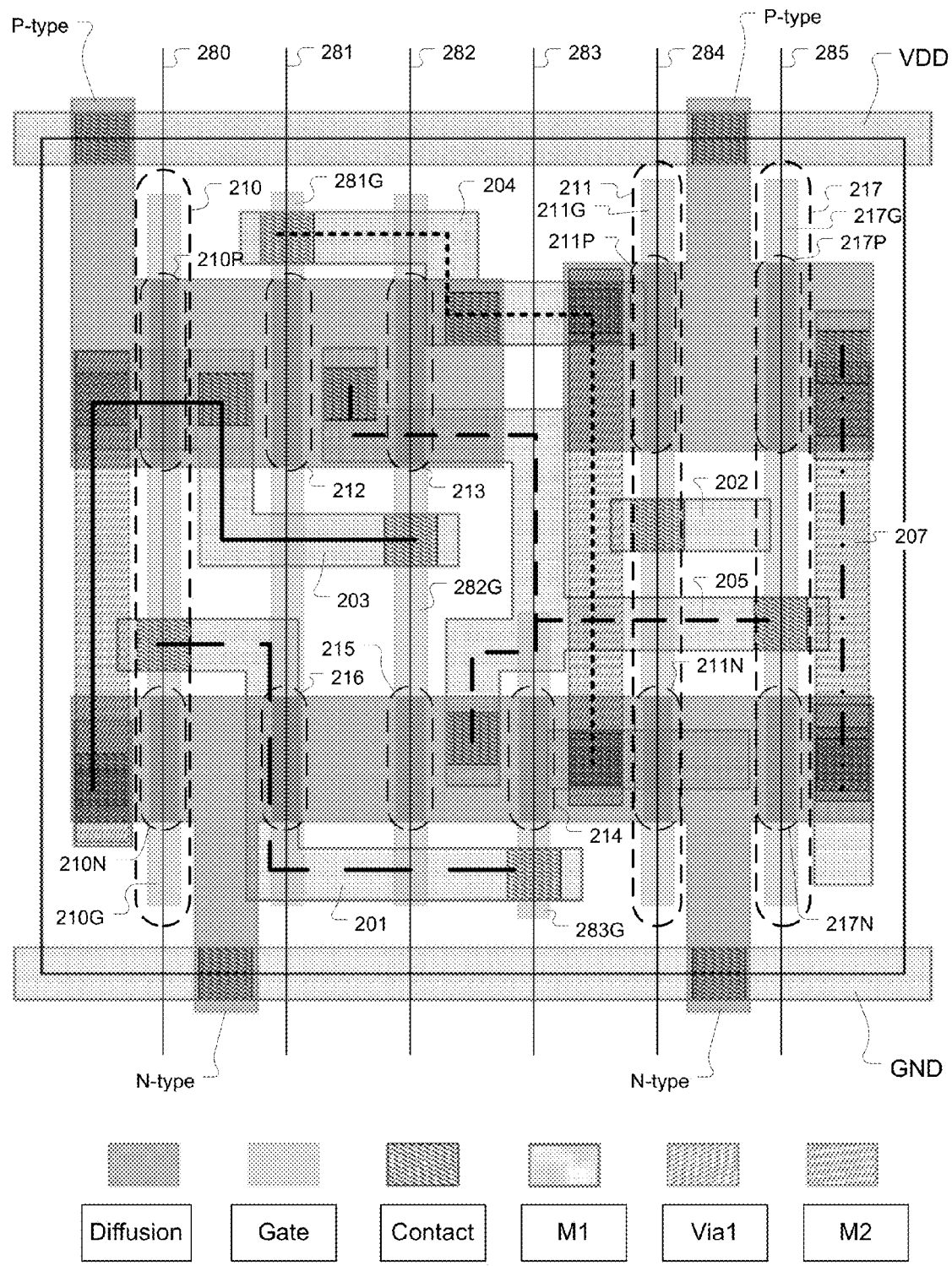
FIG. 2F shows a layout of the XNOR logic gate circuit of FIG. 2A, in accordance with one embodiment of the present invention.

FIG. 2F shows a layout of the XNOR 200, in accordance with one embodiment of the present invention. In one embodiment, the layout of the XNOR 200 is defined based on a restricted gate level layout architecture, as described herein. Inverter 210 is defined by a PMOS transistor 210P and an NMOS transistor 210N which share a contiguous gate electrode structure 210G defined along a single gate electrode track 280. Inverter 211 is defined by a PMOS transistor 211P and an NMOS transistor 211N which share a contiguous gate electrode structure 211G defined along a single gate electrode track 284. Inverter 217 is defined by a PMOS transistor 217P and an NMOS transistor 217N which share a contiguous gate electrode structure 217G defined along a single gate electrode track 285.

The NMOS transistor 216 of the pulldown logic 270 and the PMOS transistor 212 of the pass gate 260 share a contiguous gate electrode structure 281G defined along a single gate electrode track 281. The NMOS transistor 215 of the pulldown logic 270 and the PMOS transistor 213 of the transmission gate 250 share a contiguous gate electrode structure 282G defined along a single gate electrode track 282. The NMOS transistor 214 of the transmission gate 250 is defined along a single gate electrode track 283. The nodes 201-207 are defined in the XNOR 200 layout by various combinations of contacts, interconnect structures (M1, M2), and vias (Via1), so as make the connections between the various transistors as shown in FIG. 2A.

It should be appreciated that the layout of the XNOR 200, when defined in accordance with the restricted gate electrode architecture, is defined using six adjacent gate electrode tracks (280-285). In one embodiment, the six adjacent gate electrode tracks (280-285) are equally spaced apart. However, in another embodiment, different perpendicular spacings can be used to separate the six adjacent gate electrode tracks (280-285). Also, it should be appreciated that the layout of the XNOR 200, when defined in accordance with the restricted gate electrode architecture, does not require placement of opposing gate electrode line ends. In other words, there are no gate electrode structures placed end-to-end along any given gate electrode track within the XNOR 200 layout. Therefore, lithographic difficulties associated with manufacturing end-to-end spacings between gate electrode features is avoided.

Also, because there are no end-to-end gate electrode spacings positioned along a given gate electrode track between the P-type diffusion region and the N-type diffusion region, the perpendicular layout space between the P-type and N-type diffusion regions is not forced to comply with a minimum size requirement, as would be dictated by design rules associated with placement/manufacture of end-to-end gate electrode spacings. Thus, if desired in certain embodiments, the overall cell height of the XNOR 200 layout, i.e., the perpendicular distance between VDD and GND, may be reduced by spacing the P-type and N-type diffusion regions closer together.

It should be understood that the XOR 300 circuit and associated layout as described herein can be converted to an XNOR circuit and associated layout by removing the output inverter 317. In this converted configuration, the output node 307 becomes equivalent to the node 305, and the relationship between the output Q and the inputs A and B is the same as shown in the state tables of FIGS. 2B-2E for the XNOR 200.

It should also be understood that the XNOR 200 circuit and associated layout as described herein can be converted to an XOR circuit and associated layout by removing the output inverter 217. In this converted configuration, the output node 207 becomes equivalent to the node 205, and the relationship between the output Q and the inputs A and 13 is the same as shown in the state tables of FIGS. 3B-3E for the XOR 300.

Additionally, although the exemplary embodiment of FIGS. 2A and 2F show the pulldown logic 270 defined such that the gate of the NMOS transistor 216 is connected to the output of the second input inverter 211, and such that the gate of the NMOS transistor 215 is connected to the output of the first input inverter 210, it should be understood that the stack of NMOS transistors 216 and 215 can be reversed. Specifically, in one embodiment, the pulldown logic 270 is defined such that the gate of the NMOS transistor 216 is connected to the output of the first input inverter 210, and such that the gate of the NMOS transistor 215 is connected to the output of the second input inverter 211.

Restricted Gate Level Layout Architecture

As mentioned above, the XOR 300 and XNOR 200 circuits of the present invention can be implemented in a restricted gate level layout architecture within a portion of a semiconductor chip. For the gate level, a number of parallel virtual lines are defined to extend across the layout. These parallel virtual lines are referred to as gate electrode tracks, as they are used to index placement of gate electrodes of various transistors within the layout. In one embodiment, the parallel virtual lines which form the gate electrode tracks are defined by a perpendicular spacing therebetween equal to a specified gate electrode pitch. Therefore, placement of gate electrode segments on the gate electrode tracks corresponds to the specified gate electrode pitch. In another embodiment the gate electrode tracks are spaced at variable pitches greater than or equal to a specified gate electrode pitch.

Figure 4A:
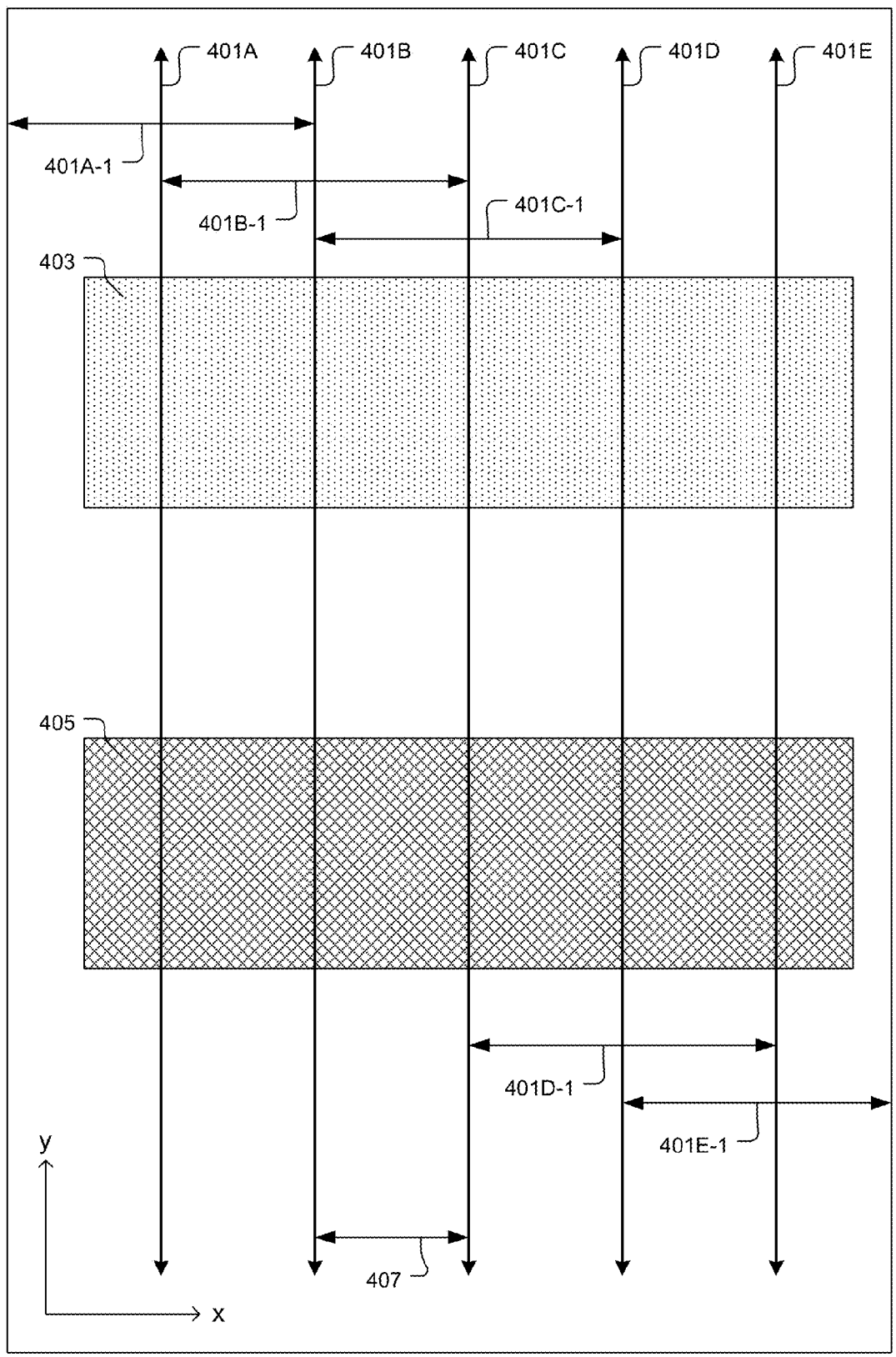
FIG. 4A shows an example of gate electrode tracks defined within the restricted gate level layout architecture, in accordance with one embodiment of the present invention.

FIG. 4A shows an example of gate electrode tracks 401A-401E defined within the restricted gate level layout architecture, in accordance with one embodiment of the present invention. Gate electrode tracks 401A-401E are formed by parallel virtual lines that extend across the gate level layout of the chip, with a perpendicular spacing therebetween equal to a specified gate electrode pitch 407. For illustrative purposes, complementary diffusion regions 403 and 405 are shown in FIG. 4A. It should be understood that the diffusion regions 403 and 405 are defined in the diffusion level below the gate level. Also, it should be understood that the diffusion regions 403 and 405 are provided by way of example and in no way represent any limitation on diffusion region size, shape, and/or placement within the diffusion level relative to the restricted gate level layout architecture.

Within the restricted gate level layout architecture, a gate level feature layout channel is defined about a given gate electrode track so as to extend between gate electrode tracks adjacent to the given gate electrode track. For example, gate level feature layout channels 401A-1 through 401E-1 are defined about gate electrode tracks 401A through 401E, respectively. It should be understood that each gate electrode track has a corresponding gate level feature layout channel. Also, for gate electrode tracks positioned adjacent to an edge of a prescribed layout space, e.g., adjacent to a cell boundary, the corresponding gate level feature layout channel extends as if there were a virtual gate electrode track outside the prescribed layout space, as illustrated by gate level feature layout channels 401A-1 and 401E-1. It should be further understood that each gate level feature layout channel is defined to extend along an entire length of its corresponding gate electrode track. Thus, each gate level feature layout channel is defined to extend across the gate level layout within the portion of the chip to which the gate level layout is associated.

Within the restricted gate level layout architecture, gate level features associated with a given gate electrode track are defined within the gate level feature layout channel associated with the given gate electrode track. A contiguous gate level feature can include both a portion which defines a gate electrode of a transistor, and a portion that does not define a gate electrode of a transistor. Thus, a contiguous gate level feature can extend over both a diffusion region and a dielectric region of an underlying chip level.

In one embodiment, each portion of a gate level feature that forms a gate electrode of a transistor is positioned to be substantially centered upon a given gate electrode track. Furthermore, in this embodiment, portions of the gate level feature that do not form a gate electrode of a transistor can be positioned within the gate level feature layout channel associated with the given gate electrode track. Therefore, a given gate level feature can be defined essentially anywhere within a given gate level feature layout channel, so long as gate electrode portions of the given gate level feature are centered upon the gate electrode track corresponding to the given gate level feature layout channel, and so long as the given gate level feature complies with design rule spacing requirements relative to other gate level features in adjacent gate level layout channels. Additionally, physical contact is prohibited between gate level features defined in gate level feature layout channels that are associated with adjacent gate electrode tracks.

Figure 4B:
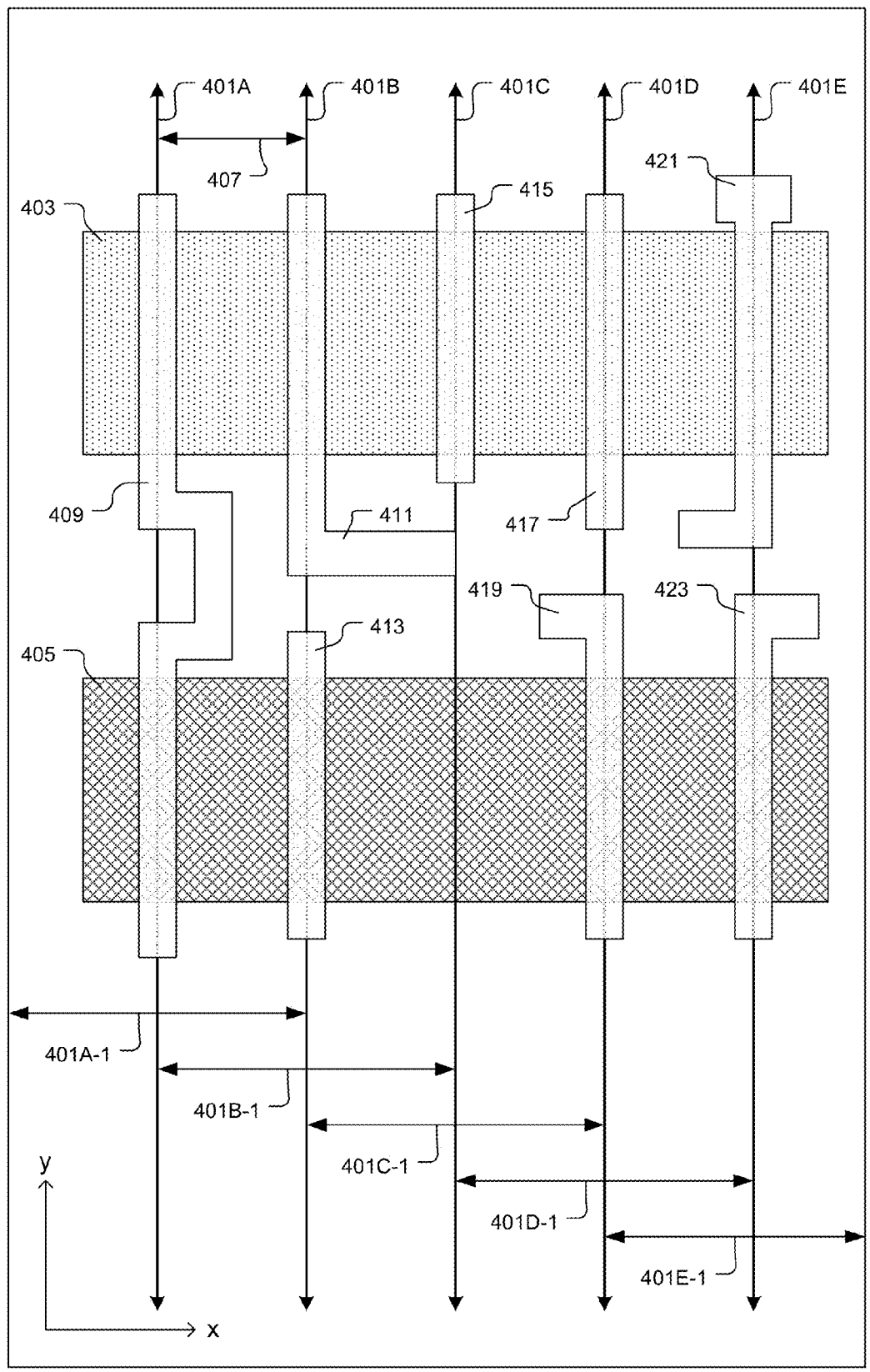
FIG. 4B shows the exemplary restricted gate level layout architecture of FIG. 4A with a number of exemplary gate level features defined therein, in accordance with one embodiment of the present invention.

FIG. 4B shows the exemplary restricted gate level layout architecture of FIG. 4A with a number of exemplary gate level features 409-423 defined therein, in accordance with one embodiment of the present invention. The gate level feature 409 is defined within the gate level feature layout channel 401A-1 associated with gate electrode track 401A. The gate electrode portions of gate level feature 409 are substantially centered upon the gate electrode track 401A. Also, the non-gate electrode portions of gate level feature 409 maintain design rule spacing requirements with gate level features 411 and 413 defined within adjacent gate level feature layout channel 401B-1. Similarly, gate level features 411-423 are defined within their respective gate level feature layout channel, and have their gate electrode portions substantially centered upon the gate electrode track corresponding to their respective gate level feature layout channel. Also, it should be appreciated that each of gate level features 411-423 maintains design rule spacing requirements with gate level features defined within adjacent gate level feature layout channels, and avoids physical contact with any another gate level feature defined within adjacent gate level feature layout channels.

A gate electrode corresponds to a portion of a respective gate level feature that extends over a diffusion region, wherein the respective gate level feature is defined in its entirety within a gate level feature layout channel. Each gate level feature is defined within its gate level feature layout channel without physically contacting another gate level feature defined within an adjoining gate level feature layout channel. As illustrated by the example gate level feature layout channels 401A-1 through 401E-1 of FIG. 4B, each gate level feature layout channel is associated with a given gate electrode track and corresponds to a layout region that extends along the given gate electrode track and perpendicularly outward in each opposing direction from the given gate electrode track to a closest of either an adjacent gate electrode track or a virtual gate electrode track outside a layout boundary.

Some gate level features may have one or more contact head portions defined at any number of locations along their length. A contact head portion of a given gate level feature is defined as a segment of the gate level feature having a height and a width of sufficient size to receive a gate contact structure, wherein "width" is defined across the substrate in a direction perpendicular to the gate electrode track of the given gate level feature, and wherein "height" is defined across the substrate in a direction parallel to the gate electrode track of the given gate level feature. It should be appreciated that a contact head of a gate level feature, when viewed from above, can be defined by essentially any layout shape, including a square or a rectangle. Also, depending on layout requirements and circuit design, a given contact head portion of a gate level feature may or may not have a gate contact defined thereabove.

A gate level of the various embodiments disclosed herein is defined as a restricted gate level, as discussed above. Some of the gate level features form gate electrodes of transistor devices. Others of the gate level features can form conductive segments extending between two points within the gate level. Also, others of the gate level features may be non-functional with respect to integrated circuit operation. It should be understood that the each of the gate level features, regardless of function, is defined to extend across the gate level within their respective gate level feature layout channels without physically contacting other gate level features defined with adjacent gate level feature layout channels.

In one embodiment, the gate level features are defined to provide a finite number of controlled layout shape-to-shape lithographic interactions which can be accurately predicted and optimized for in manufacturing and design processes. In this embodiment, the gate level features are defined to avoid layout shape-to-shape spatial relationships which would introduce adverse lithographic interaction within the layout that cannot be accurately predicted and mitigated with high probability. However, it should be understood that changes in direction of gate level features within their gate level layout channels are acceptable when corresponding lithographic interactions are predictable and manageable.

It should be understood that each of the gate level features, regardless of function, is defined such that no gate level feature along a given gate electrode track is configured to connect directly within the gate level to another gate level feature defined along a different gate electrode track without utilizing a non-gate level feature. Moreover, each connection between gate level features that are placed within different gate level layout channels associated with different gate electrode tracks is made through one or more non-gate level features, which may be defined in higher interconnect levels, i.e., through one or more interconnect levels above the gate level, or by way of local interconnect features at or below the gate level.

It should be understood that the XOR 300 and XNOR 200 circuits and layouts as disclosed herein can be stored in a tangible form, such as in a digital format on a computer readable medium. For example, the layouts of the XOR 300 and/or XNOR 200 circuits as disclosed herein can be stored in a layout data file as one or more cells, selectable from one or more libraries of cells. The layout data file can be formatted as a GDS II (Graphic Data System) database file, an OASIS (Open Artwork System Interchange Standard) database file, or any other type of data file format suitable for storing and communicating semiconductor device layouts. Also, the multi-level layouts of the XOR 300 and/or XNOR 200 circuits can be included within a multi-level layout of a larger semiconductor device. The multi-level layout of the larger semiconductor device can also be stored in the form of a layout data file, such as those identified above.

Also, the invention described herein can be embodied as computer readable code on a computer readable medium. For example, the computer readable code can include the layout data file within which the XOR 300 and/or XNOR 200 circuit layouts are stored. The computer readable code can also include program instructions for selecting one or more layout libraries and/or cells that include the XOR 300 and/or XNOR 200 circuit layouts. The layout libraries and/or cells can also be stored in a digital format on a computer readable medium.

The computer readable medium mentioned herein is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

It should be further understood that the XOR 300 and XNOR 200 circuits and layouts as disclosed herein can be manufactured as part of a semiconductor device or chip. In the fabrication of semiconductor devices such as integrated circuits, memory cells, and the like, a series of manufacturing operations are performed to define features on a semiconductor wafer. The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. An exclusive-nor logic circuit, comprising:
   a first input node;
   a second input node;
   an output node;
   a pass gate connected to be controlled by a logic state present at the second input node, the pass gate connected to pass through a version of a logic state present at the first input node to the output node when controlled to transmit by the logic state present at the second input node;
   a transmission gate connected to be controlled by the logic state present at the first input node, the transmission gate connected to pass through a version of the logic state present at the second input node to the output node when controlled to transmit by the logic state present at the first input node;
   pulldown logic connected to be controlled by both the logic state present at the first input node and the logic state present at the second input node, the pulldown logic connected to drive a state present at the output node high when both the logic state present at the first input node and the logic state present at the second input node are low;
   a first input inverter having an input connected to the first input node and an output connected to the pass gate;
   a second input inverter having an input connected to the second input node and an output connected to the transmission gate; and
   an output inverter having an input connected to each of the pass gate, transmission gate, and the pulldown logic, the output inverter also having an output connected to the output node,
   wherein the exclusive-nor logic circuit is formed by five PMOS transistors and six NMOS transistors.

2. The exclusive-nor logic circuit as recited in claim 1, wherein the pass gate is defined as a PMOS transistor having a gate connected to the output of the second input inverter such that an inverted version of the logic state present at the second input node is received at the gate of the PMOS transistor, and
   wherein the PMOS transistor has a first terminal connected to the output of the first input inverter and a second terminal connected to the input of the output inverter.

3. The exclusive-nor logic circuit as recited in claim 2, wherein the PMOS transistor is connected to transmit when the logic state at the second input node is high, such that the logic state at the output node is made to match the logic state at the first input node.

4. The exclusive-nor logic circuit as recited in claim 1, wherein the transmission gate is defined by a PMOS transistor and an NMOS transistor which each has a respective first terminal connected to the output of the second input inverter, and which each has a respective second terminal connected to the input of the output inverter, and
   wherein the NMOS transistor has a gate connected to the first input node, and wherein the PMOS transistor has a gate connected to the output of the first input inverter.

5. The exclusive-nor logic circuit as recited in claim 4, wherein both the NMOS and PMOS transistors are connected to transmit when the logic state at the first input node is high, such that the logic state at the output node is made to match the logic state at the second input node.

6. The exclusive-nor logic circuit as recited in claim 1, wherein the pulldown logic is defined by a first NMOS transistor and a second NMOS transistor, wherein the first and second NMOS transistors are serially connected between a reference ground potential and the input of the output inverter.

7. The exclusive-nor logic circuit as recited in claim 6, wherein a gate of the first NMOS transistor is connected to the output of the second input inverter, and wherein a gate of the second NMOS transistor is connected to the output of the first input inverter.

8. The exclusive-nor logic circuit as recited in claim 6, wherein a gate of the first NMOS transistor is connected to the output of the first input inverter, and wherein a gate of the second NMOS transistor is connected to the output of the second input inverter.

9. The exclusive-nor logic circuit as recited in claim 6, wherein both the first and second NMOS transistors are connected to transmit when the logic states at the first and second input nodes are both low, such that the logic state at the output node is driven high.

10. The exclusive-nor logic circuit as recited in claim 1, wherein the exclusive-nor logic circuit is defined within a semiconductor chip.

11. An exclusive-nor logic circuit layout, comprising:
five PMOS transistors; and
six NMOS transistors,
wherein the five PMOS transistors are respectively paired with five of the six NMOS transistors such that each pair of PMOS and NMOS transistors is defined to share a contiguous gate electrode structure placed along a respective one of five gate electrode tracks,
wherein a sixth of the six NMOS transistors is defined by a gate electrode structure placed along a sixth gate electrode track, such that the sixth NMOS transistor does not share the sixth gate electrode track with another transistor within the exclusive-nor logic circuit layout, and
wherein the six gate electrode tracks are oriented parallel to each other.

12. The exclusive-nor logic circuit layout as recited in claim 11, wherein the exclusive-nor logic circuit layout is devoid of co-linearly placed gate electrodes having and end-to-end spacing therebetween.

13. The exclusive-nor logic circuit layout as recited in claim 11, wherein each gate electrode structure is defined an a linear structure having a substantially rectangular cross-section when viewed in an as-drawn state.

14. The exclusive-nor logic circuit layout as recited in claim 11, wherein the six gate electrode tracks are equally spaced apart.

15. The exclusive-nor logic circuit layout as recited in claim 11, wherein the exclusive-or logic circuit layout is recorded in a digital format on a computer readable medium.

16. The exclusive-nor logic circuit layout as recited in claim 15, wherein the digital format is a data file format for storing and communicating one or more semiconductor device layouts.

17. The exclusive-nor logic circuit layout as recited in claim 15, wherein the computer readable medium includes program instructions for accessing and retrieving the exclusive-nor logic circuit layout in the digital format from the computer readable medium.

18. The exclusive-nor logic circuit layout as recited in claim 17, wherein the program instructions for accessing and retrieving include program instructions for selecting a library, a cell, or both library and cell including the exclusive-nor logic circuit layout in the digital format.

19. A method for creating a layout of an exclusive-nor logic integrated circuit, comprising:
operating a computer to define a layout of a first input node;
operating the computer to define a layout of a second input node;
operating the computer to define a layout of an output node;
operating the computer to define a layout of a pass gate connected to be controlled by a logic state present at the second input node, the pass gate connected to pass through a version of a logic state present at the first input node to the output node when controlled to transmit by the logic state present at the second input node;
operating the computer to define a layout of a transmission gate connected to be controlled by the logic state present at the first input node, the transmission gate connected to pass through a version of the logic state present at the second input node to the output node when controlled to transmit by the logic state present at the first input node; and
operating the computer to define a layout of pulldown logic connected to be controlled by both the logic state present at the first input node and the logic state present at the second input node, the pulldown logic connected to drive a state present at the output node high when both the logic state present at the first input node and the logic state present at the second input node are low;
operating the computer to define a layout of a first input inverter having an input connected to the first input node and an output connected to the pass gate;
operating the computer to define a layout of a second input inverter having an input connected to the second input node and an output connected to the transmission gate; and
operating the computer to define a layout of an output inverter having an input connected to each of the pass gate, transmission gate, and the pulldown logic, the output inverter also having an output connected to the output node,
wherein the exclusive-nor logic integrated circuit is formed by five PMOS transistors and six NMOS transistors.

* * * * *